(12) United States Patent
Niihara

(10) Patent No.: US 12,136,594 B2
(45) Date of Patent: Nov. 5, 2024

(54) SEMICONDUCTOR MEMORY DEVICE AND METHOD OF MANUFACTURING THE SAME

(71) Applicant: Kioxia Corporation, Tokyo (JP)

(72) Inventor: Shota Niihara, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 511 days.

(21) Appl. No.: 17/412,461

(22) Filed: Aug. 26, 2021

(65) Prior Publication Data
US 2022/0285271 A1 Sep. 8, 2022

(30) Foreign Application Priority Data
Mar. 3, 2021 (JP) ................. 2021-033846

(51) Int. Cl.
| | | |
|---|---|---|
| H01L 23/528 | (2006.01) | |
| H01L 21/768 | (2006.01) | |
| H01L 23/522 | (2006.01) | |
| H10B 41/27 | (2023.01) | |
| H10B 43/27 | (2023.01) | |

(52) U.S. Cl.
CPC .... *H01L 23/5283* (2013.01); *H01L 21/76816* (2013.01); *H01L 21/76877* (2013.01); *H01L 23/5226* (2013.01); *H10B 41/27* (2023.02); *H10B 43/27* (2023.02)

(58) Field of Classification Search
None
See application file for complete search history.

(56) References Cited

U.S. PATENT DOCUMENTS

| | | |
|---|---|---|
| 8,659,070 B2 | 2/2014 | Tanaka et al. |
| 9,041,093 B2 | 5/2015 | Tanaka et al. |
| 9,478,546 B2 | 10/2016 | Yang |
| 10,916,557 B2 | 2/2021 | Takeshita et al. |
| 2010/0052042 A1 | 3/2010 | Tanaka et al. |
| 2014/0124850 A1 | 5/2014 | Tanaka et al. |
| 2019/0348431 A1 | 11/2019 | Takeshita et al. |
| 2020/0251491 A1 | 8/2020 | Ozawa |

(Continued)

FOREIGN PATENT DOCUMENTS

| | | | |
|---|---|---|---|
| JP | 2008258458 A | 10/2008 | |
| JP | 6478638 B2 | 2/2019 | |

(Continued)

*Primary Examiner* — Hsien Ming Lee
(74) *Attorney, Agent, or Firm* — Holtz, Holtz & Volek PC

(57) ABSTRACT

According to one embodiment, a semiconductor memory device includes a staircase portion, a columnar body, and a contact. The columnar body is provided in a second region of a stacked body, penetrating the stacked body in a stacking direction, and having a plurality of memory cells at each positions facing the plurality of conductive layers. The contact is connected to a terrace surface. Further, the staircases included in the staircase portion are each formed to ascend for each first step having conductive layers of the plurality of conductive layers in a second direction intersecting the stacking direction and a first direction. The terrace surfaces arranged in the first direction of the terrace surfaces of the staircases are different in height from each other and are formed to ascend for each second step having one conductive layer of the plurality of conductive layers in the first direction.

10 Claims, 13 Drawing Sheets

(56) References Cited

U.S. PATENT DOCUMENTS

| | | |
|---|---|---|
| 2020/0286912 A1 | 9/2020 | Nanami et al. |
| 2022/0028440 A1* | 1/2022 | Tang .................... G11C 8/14 |
| 2022/0037351 A1* | 2/2022 | Lee .................... H10B 41/27 |

FOREIGN PATENT DOCUMENTS

| | | |
|---|---|---|
| JP | 2019201028 A | 11/2019 |
| JP | 2020126928 A | 8/2020 |
| JP | 2020145230 A | 9/2020 |

* cited by examiner

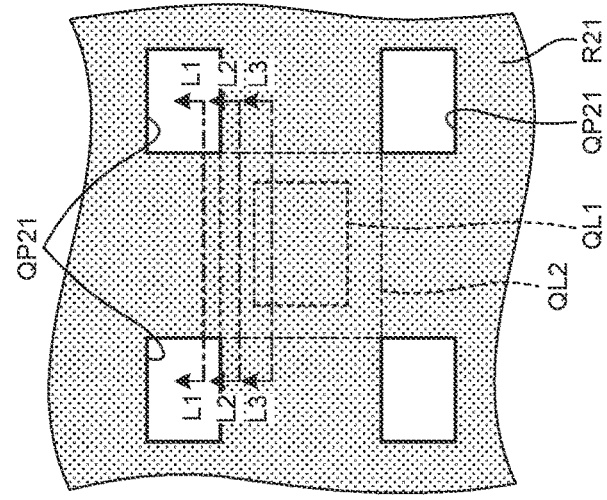
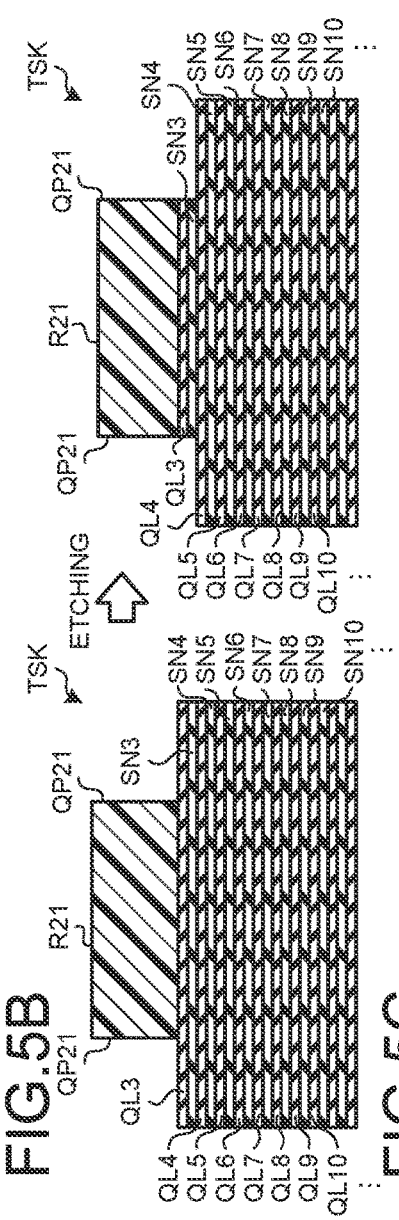
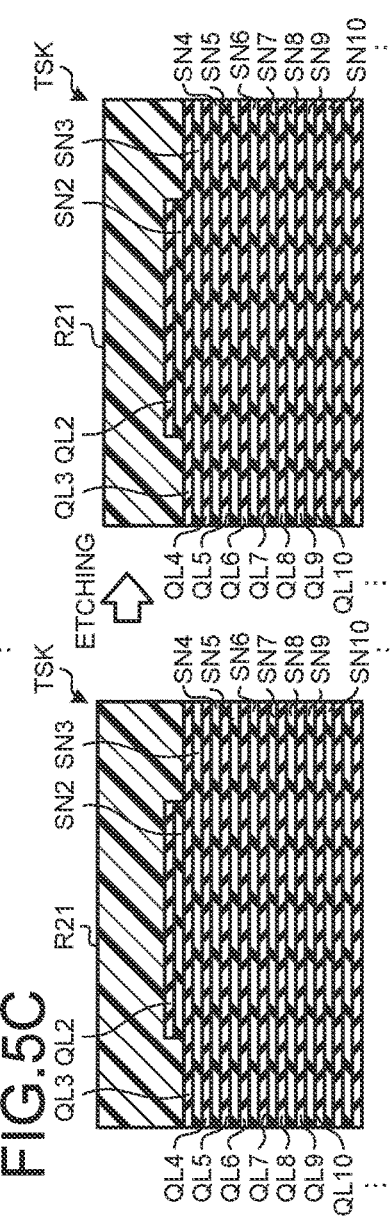
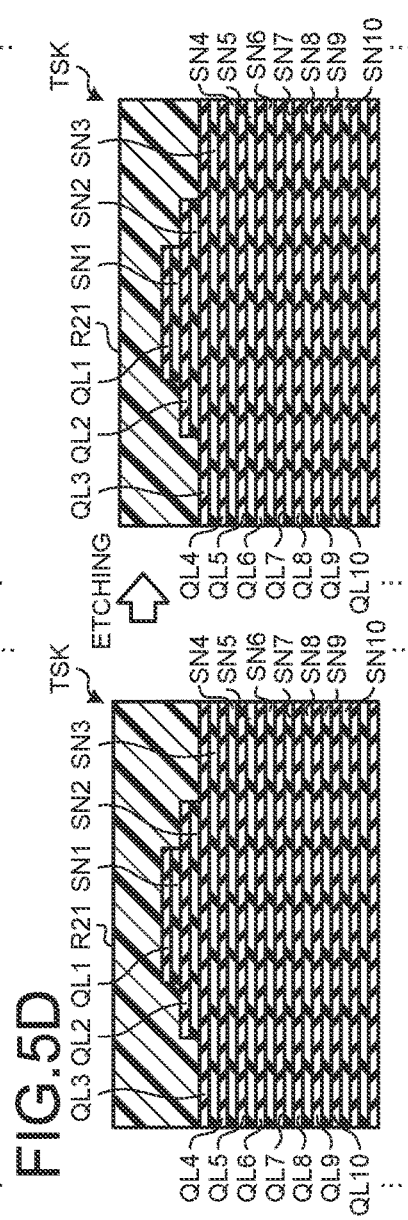

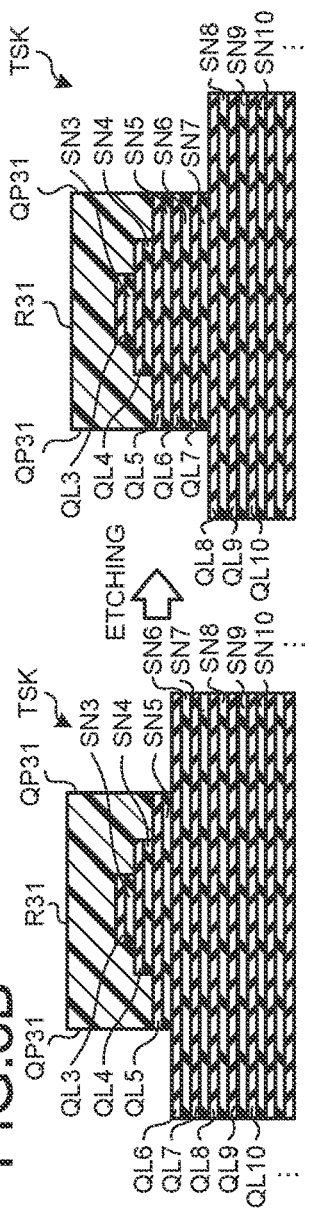
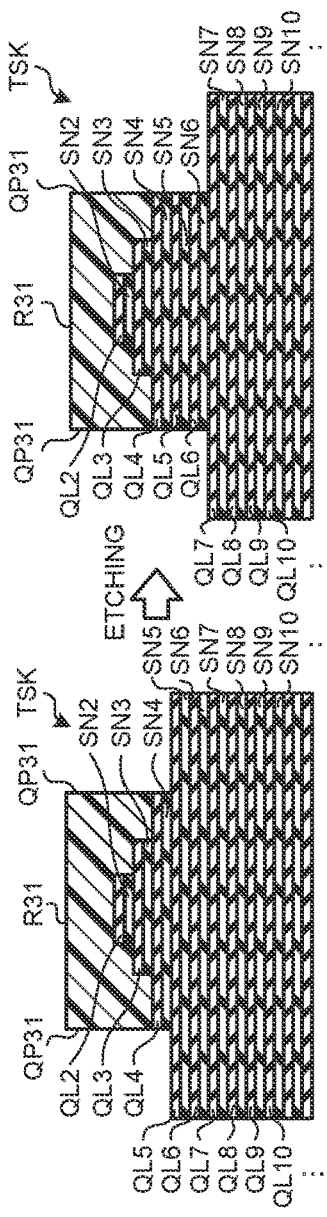
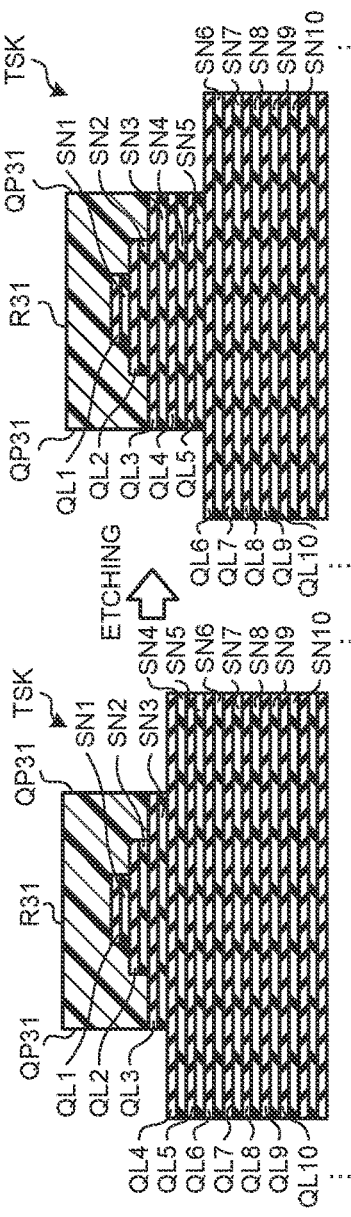
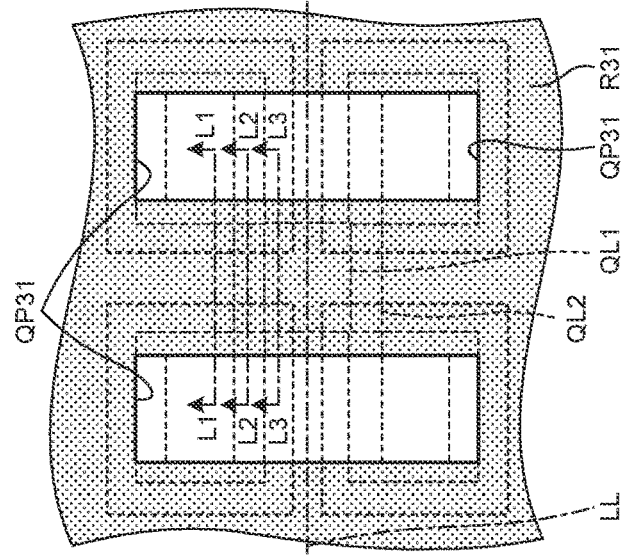

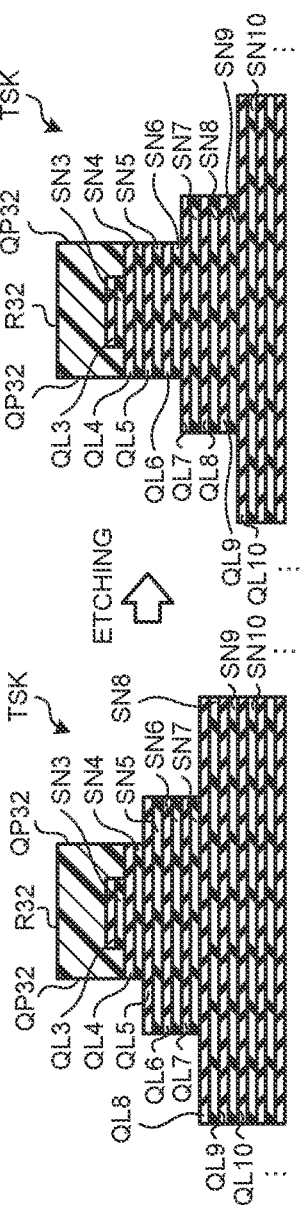
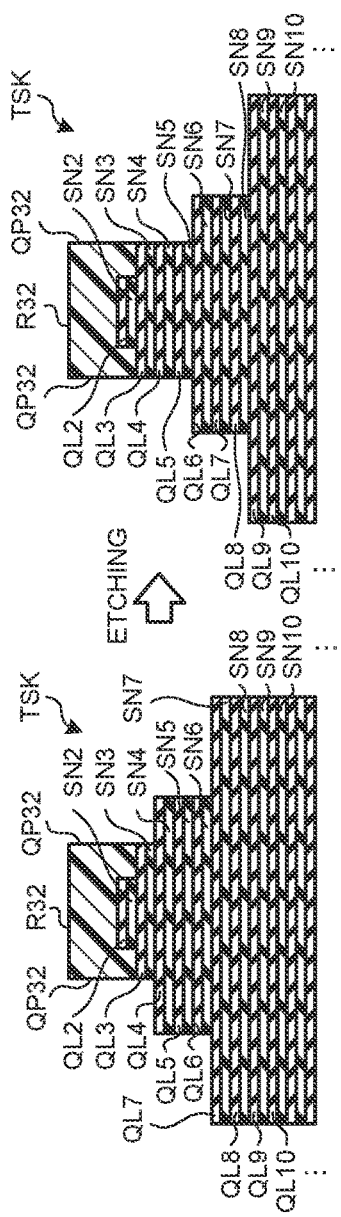
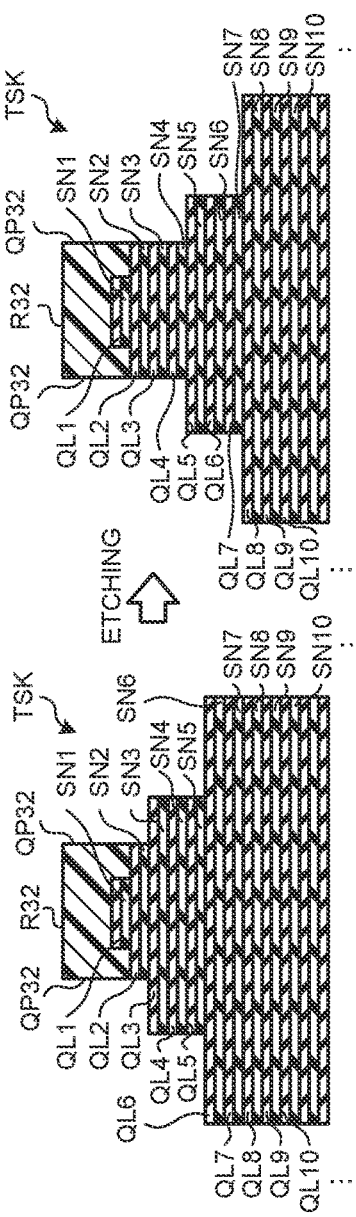
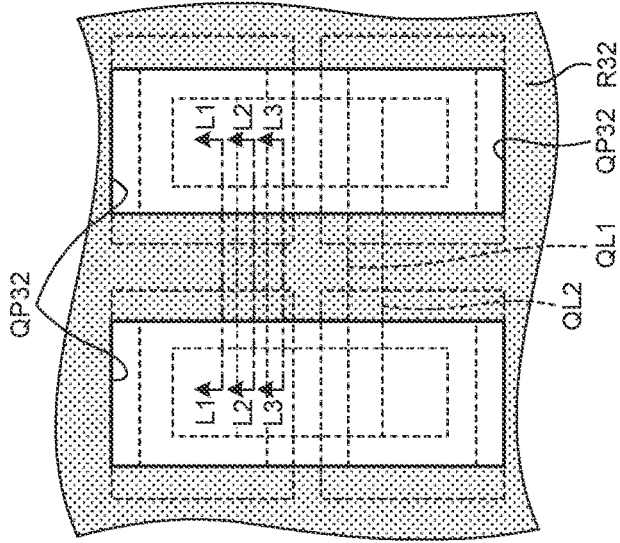

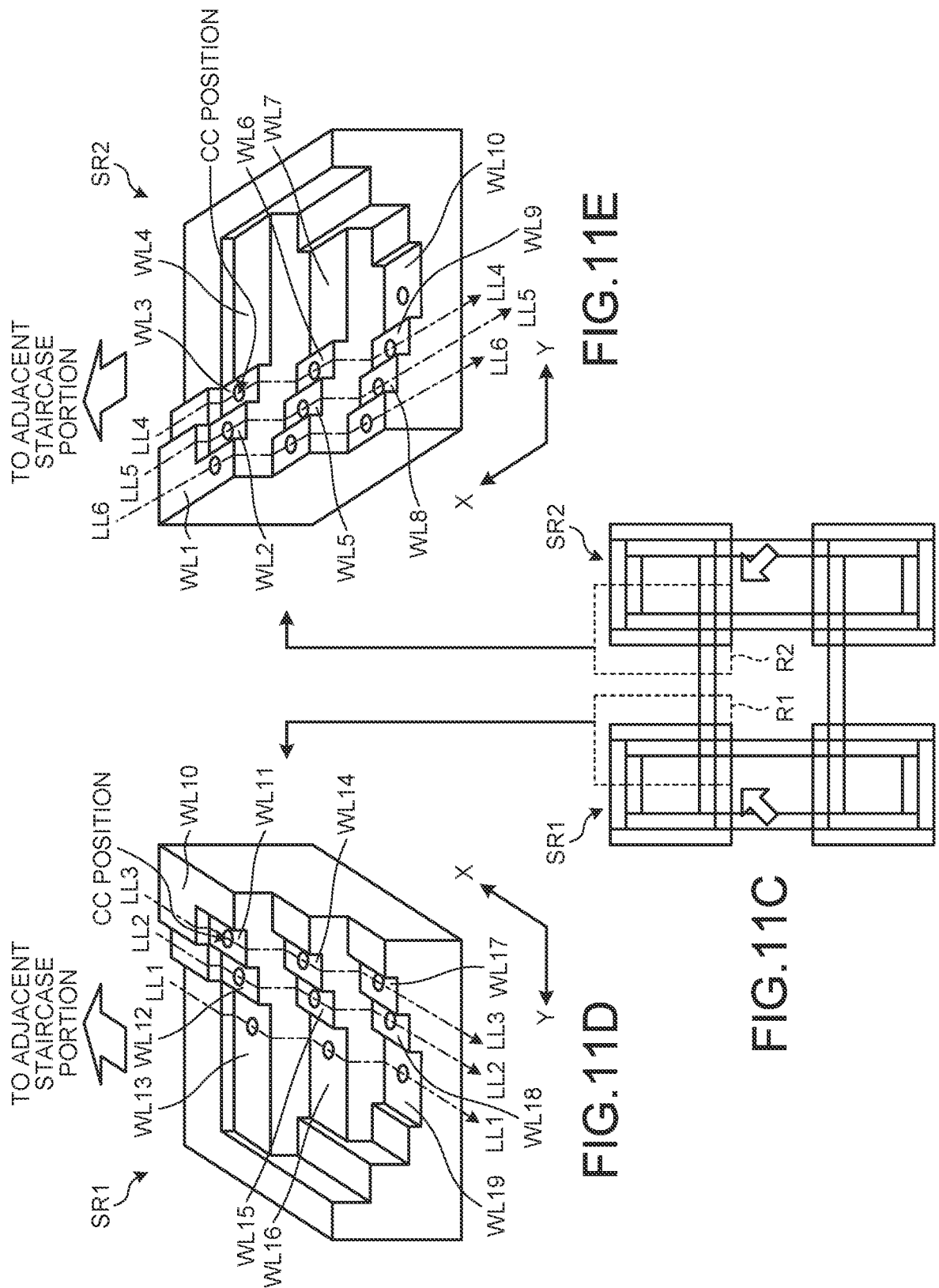

SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2021-033846, filed on Mar. 3, 2021; the entire contents of which are incorporated herein by reference.

FIELD

Embodiments described herein relate generally to semiconductor memory device and a method of manufacturing the same.

BACKGROUND

In one example, some three-dimensional semiconductor memory devices have a stacked body and a memory pillar. The stacked body has a plurality of conductive layers and a plurality of insulating layers alternately arranged on top of each other one by one. The memory pillar penetrates the stacked body in the stacking direction and has a memory cell formed in a portion facing the conductive layer. The conductive layer functions as a word line for the memory cell controlled via a contact connected to each terrace surface (stair tread surface) processed as a staircase shape.

Such a semiconductor memory device tends to have an increased number of stacked bodies to expand its storage capacity. This increases the number of steps in the staircase shape and lengthens the staircase, preventing the semiconductor memory device from miniaturizing.

BRIEF DESCRIPTION OF THE DRAWINGS

FIGS. 5A to 5D are diagrams illustrated to describe a method of forming a staircase portion of the semiconductor memory device according to the embodiment;

FIGS. 8A to 8D are diagrams illustrated to describe a method of forming a staircase portion of the semiconductor memory device according to the embodiment;

FIGS. 9A to 9D are diagrams illustrated to describe a method of forming a staircase portion of the semiconductor memory device according to the embodiment;

FIGS. 11C to 11E are diagrams illustrated to describe an example of the arrangement of a contact in the staircase portion of the semiconductor memory device according to the embodiment.

DETAILED DESCRIPTION

Figure 1:
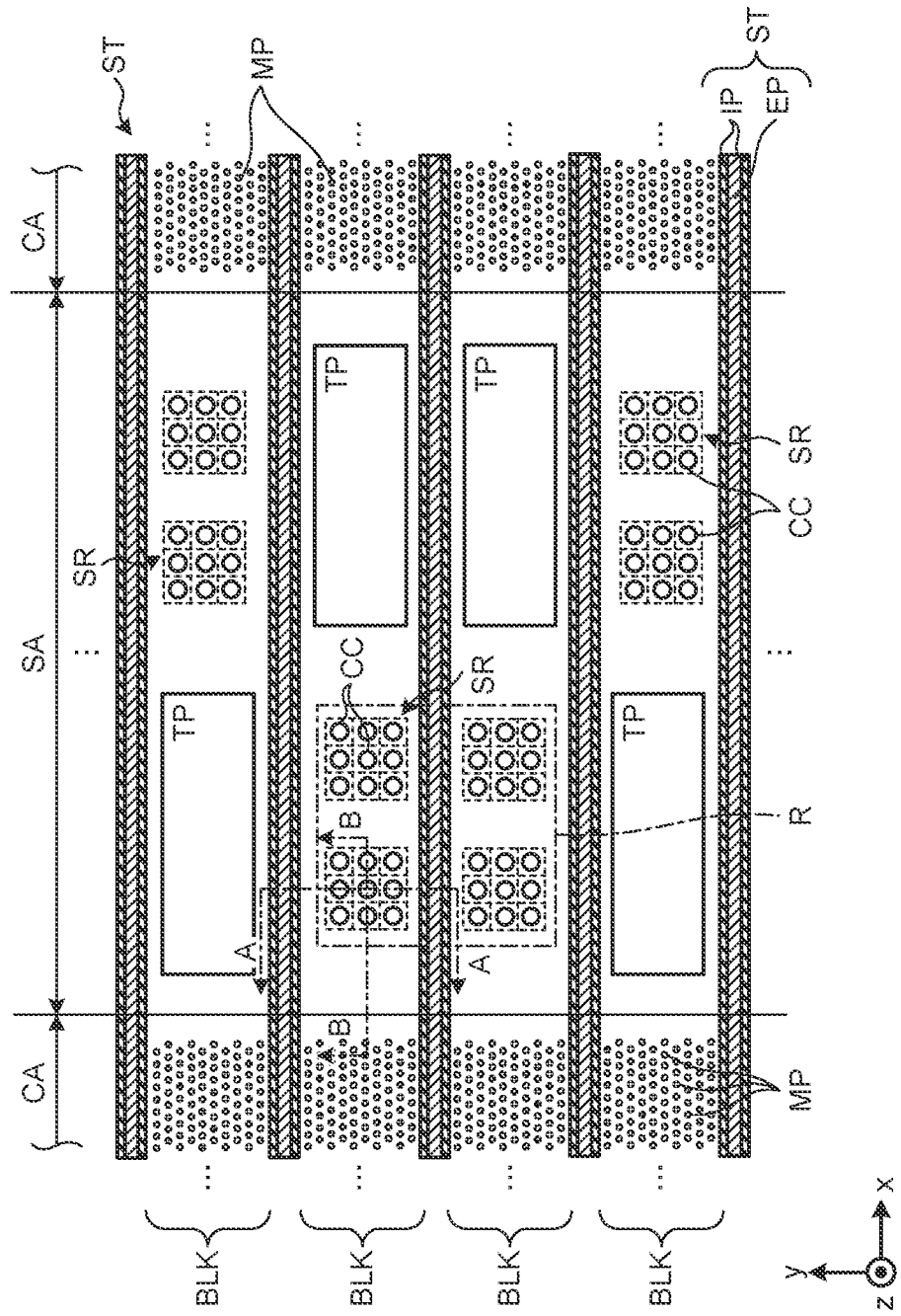
FIG. 1 is a partial top view of a semiconductor memory device according to an embodiment.

According to an embodiment, a semiconductor memory device includes a staircase portion, a columnar body, and a contact. The staircase portion is provided in a first region of a stacked body and provided with staircases, the stacked body having a plurality of conductive layers and a plurality of insulating layers stacked alternately one by one, the staircase portion having the conductive layers as a terrace surfaces, and the staircases being arranged in n rows (where n is an integer of three or more) in a first direction intersecting a stacking direction of the stacked body. The columnar body is provided in a second region of the stacked body, penetrating the stacked body in the stacking direction, and having a plurality of memory cells at each positions facing the plurality of conductive layers. The contact is connected to the terrace surface. The staircases included in the staircase portion are each formed to ascend for each first step having p (n=p) conductive layers of the plurality of conductive layers in a second direction intersecting the stacking direction and the first direction. The terrace surfaces arranged in the first direction of the terrace surfaces of the staircases are different in height from each other and are formed to ascend for each second step having one conductive layer of the plurality of conductive layers in the first direction.

Non-limiting exemplary embodiments of the present invention are now described with reference to the accompanying drawings. In all the accompanying drawings, the same or corresponding reference numerals are assigned to identical or corresponding members or parts, and so a duplicate description thereof is omitted. In addition, the drawings do not intend to indicate a relative ratio between members or parts or between thickness values of various layers. Thus, specific thickness or dimension can be determined by one of ordinary skill in the art in view of non-limiting embodiments below.

Figure 2A:
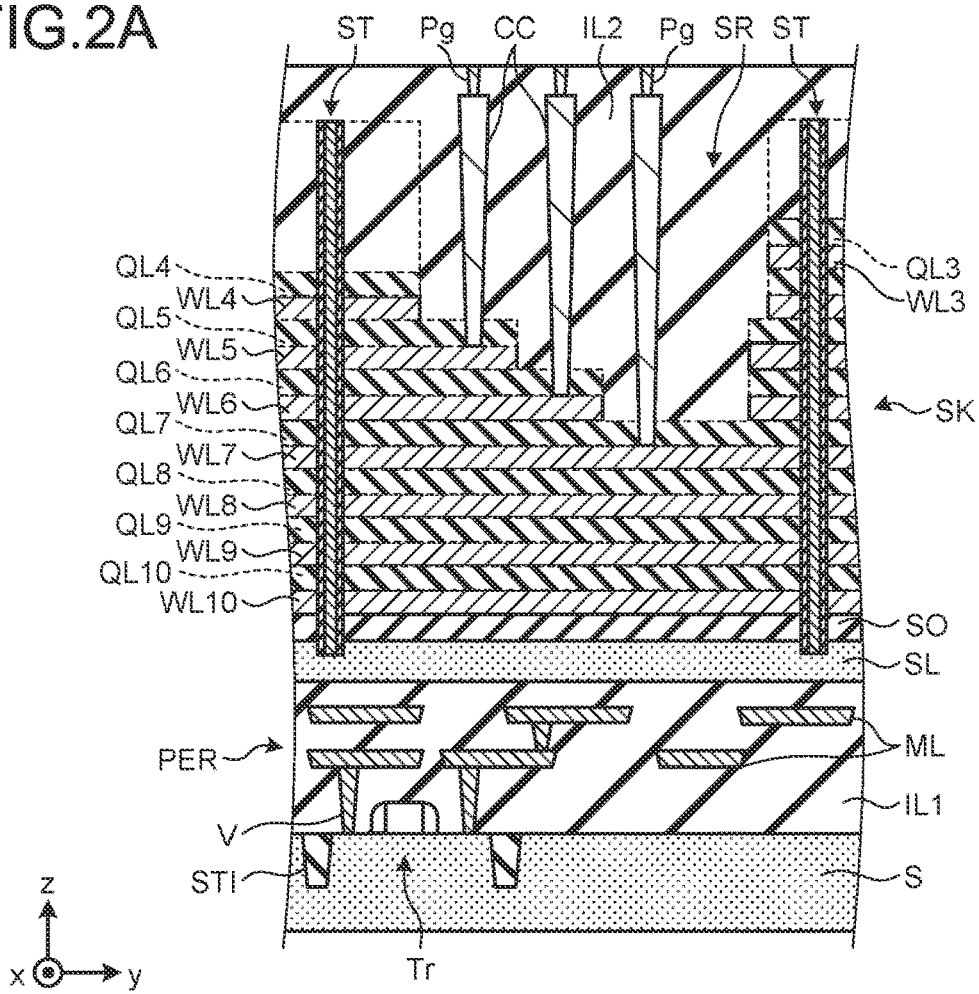
FIG. 2A is a cross-sectional view taken along line A-A of FIG. 1.
Figure 2B:
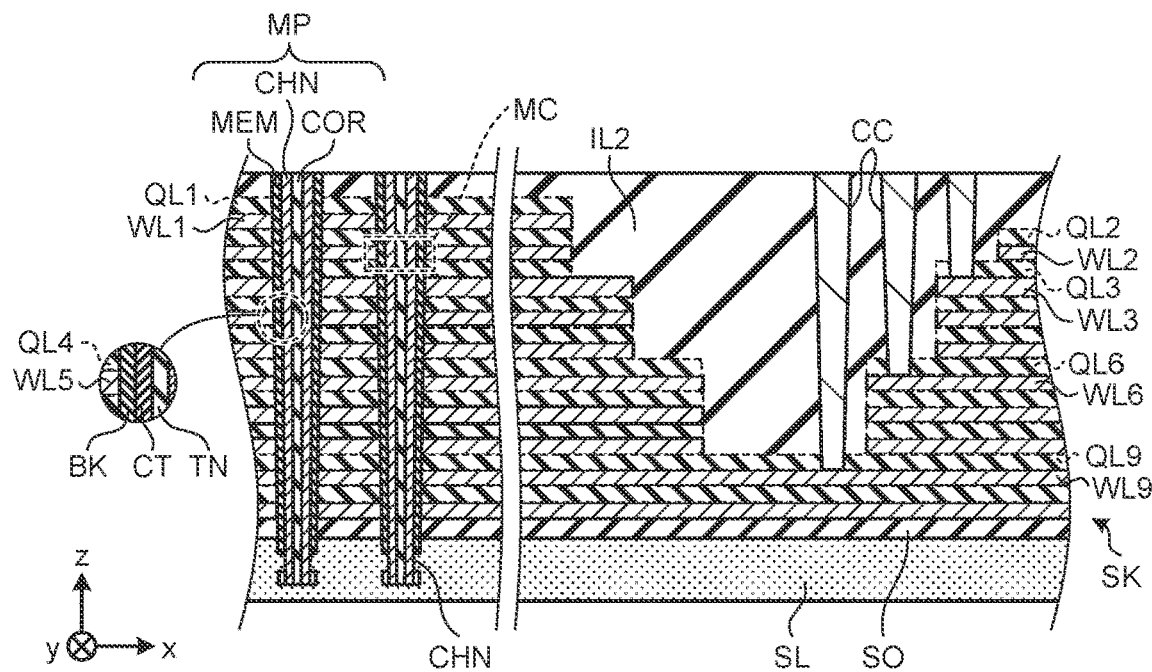
FIG. 2B is a cross-sectional view taken along line B-B of FIG. 1.

A semiconductor memory device according to an embodiment is described with reference to FIGS. 1 to 2B. FIG. 1 is a partial top view of the semiconductor memory device according to the embodiment, FIG. 2A is a cross-sectional view taken along line A-A of FIG. 1, and FIG. 2B is a cross-sectional view taken along line B-B of FIG. 1. A semiconductor memory device according to the present embodiment has, for example, a substantially rectangular substrate, a peripheral circuit portion, and a memory element portion. The substrate is formed of, for example, a semiconductor material such as silicon. The peripheral circuit portion is arranged on the substrate. The memory element portion is arranged on the peripheral circuit portion. The memory element portion includes a stacked body having a plurality of conductive layers and a plurality of insulating layers alternately arranged on top of each other one by one, as described later. The stacked body is partitioned into a cell array region CA and a staircase region SA illustrated in FIG. 1.

Referring to FIG. 1, a plurality of memory pillars MP is provided in the cell array region CA. The memory pillars MP are periodically arrayed in the x-direction and the y-direction in the figure, each of which extending in the z-direction in the figure. The structure of the memory pillar MP will be described later with reference to FIG. 2B.

Further, the semiconductor memory device is provided with a plurality of plate-like portions ST that divides the cell array region CA and the staircase region SA into a plurality of blocks BLK. Each plate-like portion ST crosses the cell array region CA and the staircase region SA in the x-direction, extends in the z-direction in the figure as illustrated in FIG. 2A, and terminates in a source line SL described later. The plate-like portion ST has a conductive portion EP and an insulating portion IP covering the conductive portion EP. Specifically, the insulating portion IP is formed by forming an elongated groove-shaped slit in the stacked body of the cell array region CA and the staircase region SA and depositing an insulating material on the inner wall of the slit. The plate-like portion ST is formed by embedding a conductive material in the space inside the insulating portion IP to form the conductive portion EP. The conductive portion EP is connected to the source line SL described later, and the plate-like portion ST can function as a source contact. However, the plate-like portion ST does not necessarily have the conductive portion P. In this case, the entire inside of the slit is embedded with an insulating material to make the plate-like portion ST get an insulating property. Moreover, the slit is used in forming the conductive layer in the stacked body, as described later.

Two staircase portions SR are provided in the staircase region SA of each block BLK. A contact CC extending in the z-direction in the figure is connected to a terrace surface of each staircase of the staircase portion SR. In each of the staircase portions SR, the terrace surfaces (stair tread surfaces), as described later, are arranged in a planar-view grid pattern in the present embodiment. Specifically, the staircase portion SR has three rows of staircases arranged in the y-direction, and each row has three steps arranged in the x-direction. In addition, in the present embodiment, in the two adjacent blocks BLK, the staircase portions SR are arranged to be symmetrical to each other with respect to the plate-like portion ST.

With reference to FIG. 2A, a transistor Tr Isolated by an isolation portion STI is formed on the surface layer of a substrate S. A first interlayer insulating film IL1 formed of, for example, an insulating material such as silicon oxide is arranged on the transistor Tr and the substrate S. In the first interlayer insulating film IL1, a via V or wiring ML is provided. The via V is connected to the gate or the like of the transistor Tr. The transistor Tr, the via V, the wiring ML, and the first interlayer insulating film IL1 constitute a peripheral circuit portion PER that controls a memory cell described later. The source line SL is formed on the first interlayer insulating film IL1. The source line SL can be formed of, for example, conductive polycrystalline silicon to which impurities such as arsenic or antimony are added.

The staircase portion SR is provided above the source line SL via an insulating film SO formed of, for example, silicon oxide. The staircase portion SR includes a stacked body SK. On the stacked body SK, a plurality of insulating layers QLm and a plurality of conductive layers WLm are alternately arranged on top of each other one by one (where m is an integer of 3 to 10 in the illustrated example). The insulating layer QLm can be formed of, for example, an insulating material such as silicon oxide, and the conductive layer WLm can be formed of, for example, a metal such as tungsten.

In the illustrated example, the lower part of the stacked body SK, that is, the conductive layers WL7 to WL10 and the insulating layers QL7 to QL10 near the source line SL extend continuously in the y-direction between the plate-like portions ST, that is, in the block BLK. On the other hand, the conductive layers WL3 to WL6 and the insulating layers QL3 to QL6 above the insulating layer QL7 are separated from each other in the block BLK. In this regard, the conductive layers WL4 to WL6 extending in the y-direction from the plate-like portion ST on the left side in the figure are shortened in length as the distance from the insulating layer QL7 increases. This arrangement forms a staircase shape in which the staircases descending in the y-direction from the plate-like portion ST on the left side in the figure are formed by using the conductive layers WL4 to WL6 as their terrace surfaces. In addition, a second interlayer insulating film IL2 is formed to cover the staircase shape. The second interlayer insulating film IL2 is formed of the same insulating material as the insulating layer QLm (e.g., silicon oxide). Thus, the insulating layers QL3 to QL6 covered with the second interlayer insulating film IL2 are substantially integrated with the second interlayer insulating film. In addition, as described later, at the position illustrated in FIG. 2B, the insulating layers QL1 to QL9 are substantially integrated with the second interlayer insulating film IL2.

The second interlayer insulating film IL2 and the contacts CC are connected individually to the corresponding conductive layers WL5, WL6, and WL7 served as terrace surfaces. The contacts CC each penetrate the corresponding insulating layer QL5, QL6, or QL7. The contact CC is formed of, for example, a metal such as tungsten or molybdenum and is connected to upper wiring (not illustrated) at the upper end via a plug Pg.

Further, in the staircase region SA of each block BLK, a penetrated connecting portion TP is provided so that it is adjacent to the staircase portion SR in the x-direction. A penetration contact is provided in the penetrated connecting portion TP. The penetration contact penetrates, for example, the penetrated connecting portion TP and is connected to a peripheral circuit of the peripheral circuit portion PER at the lower end. In addition, the penetration contact is connected to the upper wiring (not illustrated) at the upper end via a plug. Thus, the peripheral circuit, the conductive layers WL5, WL6, and WL7, and the like are electrically connected to each other via the penetration contact, plug or the like, upper wiring, plug Pg, and contact CC. The conductive layer WLm functions as a word line of a memory cell described later, and so the memory cell is controlled by the peripheral circuit.

Moreover, in the case where the insulating layers QL3, QL4, QL5, . . . , QL10 are not individually described, they can sometimes be simply hereinafter referred to as the insulating layer QL. In addition, the conductive layers WL3, WL4, WL5, . . . , WL10 can sometimes be simply referred to as the conductive layer WL.

FIG. 2B is a cross-sectional view taken along line B-B of FIG. 1. However, the peripheral circuit portion PER provided below the staircase portion SR has a similar configuration to that illustrated in FIG. 2A, and so the illustration thereof is omitted. In addition, the plug or the like connected to the contact CC is also omitted.

With reference to FIG. 2B, a staircase shape ascending in the x-direction is formed having three conductive layers WL9, WL6, and WL3 as terrace surfaces. The second interlayer insulating film IL2 and the contacts CC are connected individually to the corresponding conductive layers WL9, WL6, and WL3. The contacts CC each Penetrate the corresponding insulating layers QL9, QL6, or QL3. The staircase that has the conductive layers WL7, WL6, and WL5 as terrace surfaces illustrated in FIG. 2A, is formed to ascend in the y-direction for each step including one insulating layer, specifically for each set of conductive layer WL and insulating layer QL. On the other hand, the staircase illustrated in FIG. 2B is formed to ascend in the x-direction for each step including the three insulating layers, specifically, for each of the three sets of the conductive layer WL and the insulating layer QL. As described above, in the staircase portion SR, the height of one step in the x-direction and the y-direction in FIG. 1, that is, the height of the riser is different.

The memory pillar MP penetrates the stacked body SK along the z-direction, which is the stacking direction of the stacked body SK, and terminates in the source line SL. The memory pillar MP has a bottomed, substantially cylindrical shape. The memory pillar MP has a core layer COR, a channel layer CHN, and a memory film MEM, which are formed concentrically from the center to the outside. In this arrangement, the core layer COR can be formed of, for example, silicon oxide. The channel layer CHN can be formed of, for example, conductive polycrystalline silicon, amorphous silicon, or the like. In addition, as illustrated in FIG. 2B, the memory film, MEM has a tunnel insulating layer TN, a charge storage layer CT, and a block insulating layer BK, which are sequentially formed along the direction from the center of the memory pillar MP toward the outside. The tunnel insulating layer TN and the block insulating layer BK can be formed of, for example, silicon oxide. The charge storage layer CT can be formed of, for example, silicon nitride.

In the stacked body SK, a portion in which the uppermost conductive layer WL1 of the conductive layers WL faces the memory film MEM of the memory pillar MP functions as a drain-side selection transistor. A portion in which the lowest conductive layer WL (a conductive layer WL10 in the illustrated example) of the conductive layers WL faces the memory pillar MP functions as a source-side selection transistor. A portion in which the remaining conductive layers WL faces the memory film MEM functions as a memory cell MC. These conductive layers WL function as a word line of the memory cell MC.

Further, in the source line SL, a part of the memory film MEM of the memory pillar MP is removed, and the channel layer CHN constitutes the outer surface of the memory pillar MP. The portion that defines the outer surface of the channel layer CHN is in contact with the source line SL. This connects the channel layer CHN with the source line SL electrically.

Figure 3A:
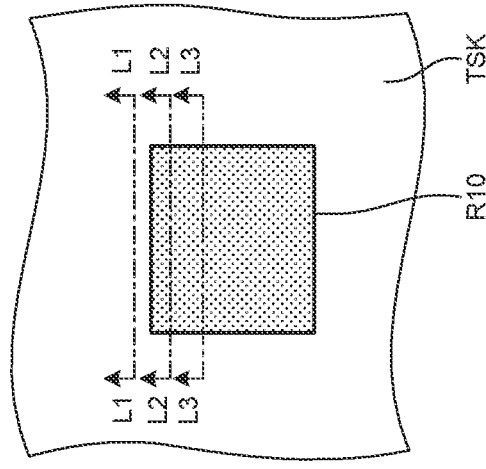
FIGS. 3A to 3D are diagrams illustrated to describe a method of forming a staircase portion of the semiconductor memory device according to the embodiment.

The description is now given of a method of forming the staircase portion SR with reference to FIGS. 3A to 9D. FIG. 3A is a top view, FIG. 3B is a cross-sectional view taken along line L1-L1 of FIG. 3A, FIG. 3C is a cross-sectional view taken along line L2-L2 of FIG. 3A, and FIG. 3D is a cross-sectional view taken along line L3-L3 of FIG. 3A. In addition, FIGS. 3B, 3C, and 3D illustrate cross-sectional views before and after etching. Moreover, the top view and cross-sectional views of FIGS. 4A to 9D are illustrated similarly to those of FIGS. 3A to 3D. In addition, in the formation method below, four staircase portions SR surrounded by the alternate long and short dash line R in FIG. 1 are formed simultaneously. The plate-like portion ST illustrated in FIG. 1 is omitted in FIGS. 3A to 9D. This is because the plate-like portion is formed after the formation of the staircase portion SR.

Figure 3B:
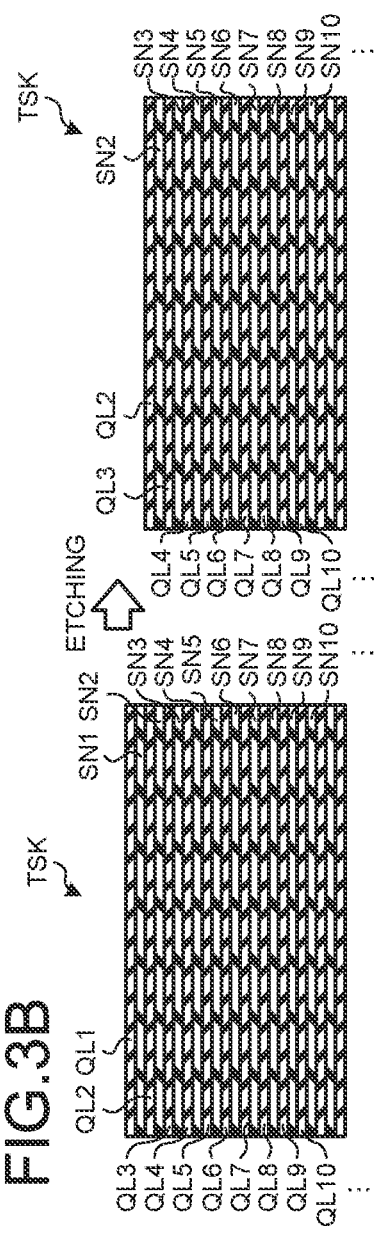

With reference to FIGS. 3A and 3B, a stacked body TSK is formed. The stacked body TSK has the plurality of insulating layers QL1 to QL10 and a plurality of sacrificial layers SN1 to SN10 alternately arranged on top of each other one by one. The plurality of insulating layers QL1 to QL10 can have substantially the same thickness as each other, and the plurality of sacrificial layers SN1 to SN10 can also have substantially the same thickness as each other. In addition, the thickness values of the insulating layer and the sacrificial layer can be substantially the same. The insulating layers QL1 to QL10 can be formed of, for example, silicon oxide, and the sacrificial layers SN1 to SN10 can be formed of, for example, silicon nitride. Moreover, the stacked body TSK is provided above the source line SL via the insulating film SO (FIGS. 2A and 2B). Still, for convenience of illustration, the insulating film SO, the source line SL, and their underlying structure are omitted. In addition, a temporary staircase portion is formed in the stacked body TSK by the formation method below, and the sacrificial layers SN1 to SN10 in the staircase portion will be replaced with conductive layers WL1 to WL10 (FIGS. 2A and 2B) in a later process to form the staircase portion SR. Moreover, FIGS. 3A to 9D illustrate a suitable number of insulating layers and conductive layers for the purpose of description. However, the number of these layers is not limited to the illustrated example and can be determined in consideration of the storage capacity of the semiconductor memory device being manufactured, that is, the number of memory cells formed in the memory pillar MP.

Figure 3C:
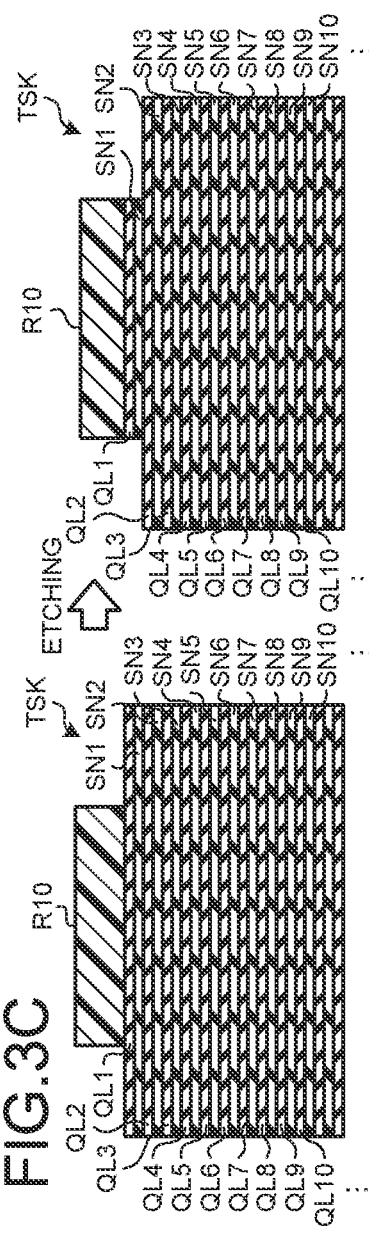
Figure 3D:
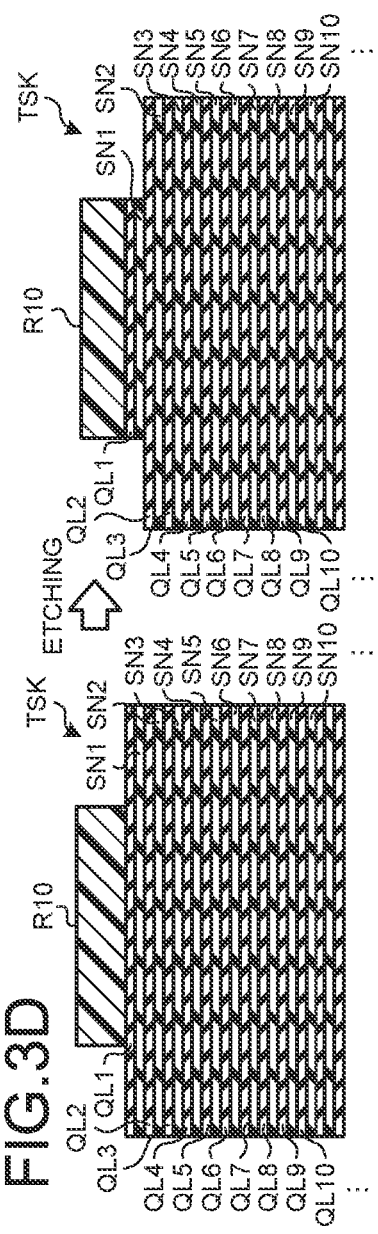

As illustrated in FIG. 3A, a photoresist film R10 having a planar-view rectangular shape is first formed on the upper surface of the stacked body TSK. Subsequently, the first etching is performed using the photoresist film R10 as a mask. Specifically, this allows the insulating layer QL1 and the sacrificial layer SN1 exposed on the surface of the stacked body TSK to be etched in the region uncovered with the photoresist film R10 as illustrated in FIG. 3B, exposing the insulating layer QL2. In other words, the etching amount in this etching processing corresponds to the amount of a set of the insulating layer QL1 and the sacrificial layer SN1. In addition, in the region covered with the photoresist film R10, the insulating layer QL1 and the sacrificial layer SN1 remain convex, as illustrated in FIGS. 3C and 3D. Moreover, the etching amount is the same in the second to fifth etching processing described below.

Figure 4A:
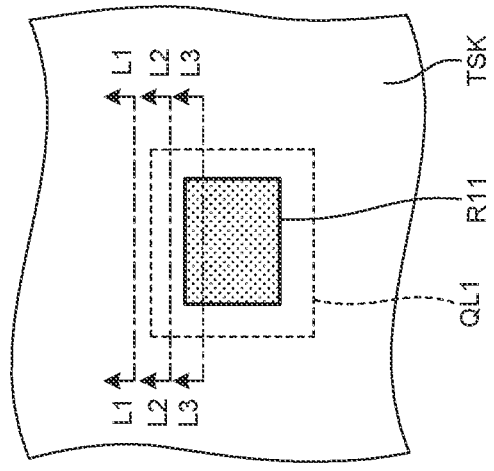
FIGS. 4A to 4D are diagrams illustrated to describe a method of forming a staircase portion of the semiconductor memory device according to the embodiment.
Figure 4B:
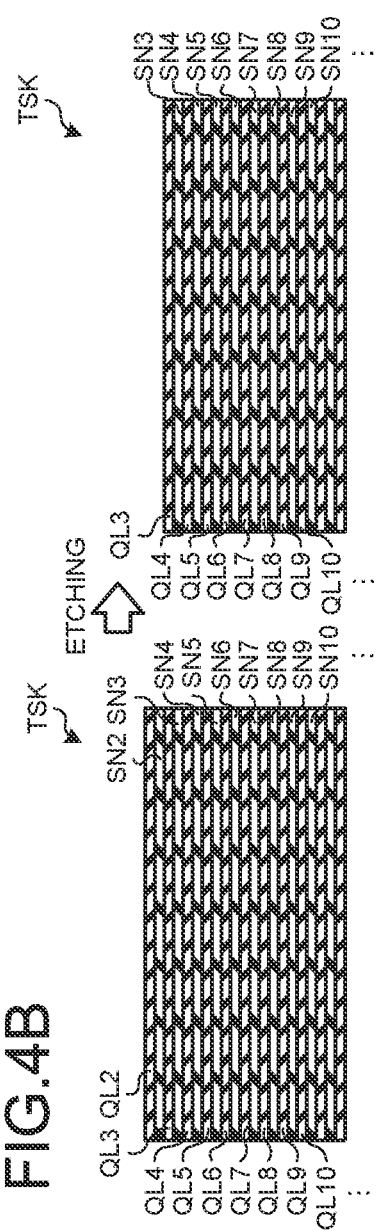

Then, as illustrated in FIG. 4A, the photoresist film R10 is slimmed to form a photoresist film R11 having a planar-view rectangular shape smaller than that of the photoresist film R10. The second etching is performed using the photoresist film R11 as a mask. Here, as illustrated in FIG. 4A, in the region where the insulating layer QL2 is exposed without being covered with the photoresist film R11, the insulating layer QL2 and the sacrificial layer SN2 being exposed are removed, exposing the insulating layer QL3.

Figure 4C:
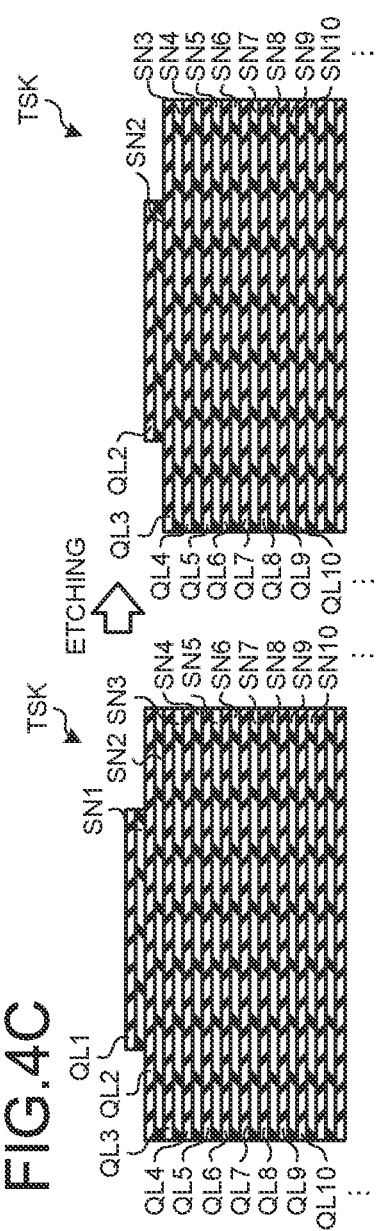

Further, in the region where the insulating layer QL1 and the sacrificial layer SN1, which are convex, are formed without being covered with the photoresist film R11, as illustrated in FIG. 4C, the insulating layer QL1 and the sacrificial layer SN1, which are convex, are transferred in shape to the insulating layer QL2 and the sacrificial layer SN2. Thus, the insulating layer QL2 and the sacrificial layer SN2, which are convex, are obtained, exposing the insulating layer QL3 around the obtained layers.

Figure 4D:
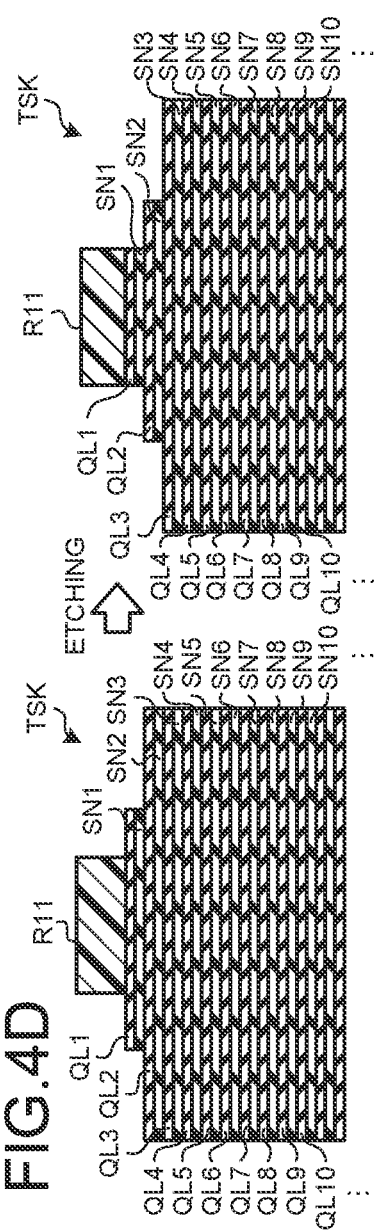

Furthermore, in the region where the photoresist film R11 is provided on the insulating layer QL1 and the sacrificial layer SN1, which are convex and formed by the first etching, as illustrated in FIG. 4D, the insulating layer QL1 and the sacrificial layer SN1, which are convex, are transferred in shape to the insulating layer QL2 and the sacrificial layer SN2. Thus, the convex insulating layer QL2 and sacrificial layer SN2 are obtained, exposing the insulating layer QL3 around the obtained layers. In addition, the convex insulating layer QL1 and sacrificial layer SN1 remain under the photoresist film R11, exposing the insulating layer QL2 around the remaining layers. This allows the large convex insulating layer QL2 and sacrificial layer SN2 and the small convex insulating layer QL1 and sacrificial layer SN1 to be formed in two steps on the insulating layer QL3.

Then, referring to FIG. 5A, a photoresist film R21 is formed on the stacked body TSK. The photoresist film R21 is provided with four openings QP21 having a planar-view rectangular shape. As illustrated in the figure, these openings QP21 are arranged so that each opening corner of the openings QP21 is in contact with four respective corners of the convex insulating layer QL2 and sacrificial layer SN2 formed by the etching so far and the long sides of the insulating layer QL2 and the opening QP21 are continuous. The opening QP21 exposes the insulating layer QL3.

When the third etching is performed using the photoresist film R21 as a mask, as illustrated in FIG. 5B, the insulating layer QL3, which is exposed through the opening QP21, and the sacrificial layer SN3 below the insulating layer QL3 are removed to be a concave shape, and so the insulating layer QL4 is exposed. In other words, a convex portion defined by the insulating layer QL3 and the sacrificial layer SN3 is formed on the insulating layer QL4. On the other hand, as illustrated in FIGS. 5C and 5D, the region covered with the photoresist film R21 does not change even after this etching.

Figure 6B:
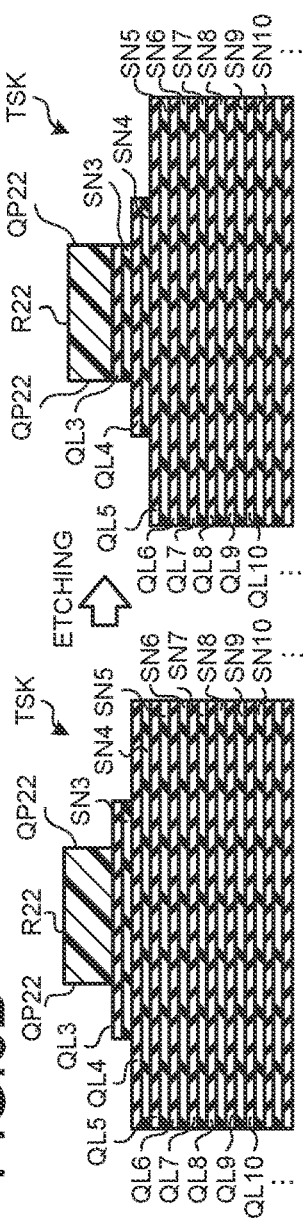
FIGS. 6A to 6D are diagrams illustrated to describe a method of forming a staircase portion of the semiconductor memory device according to the embodiment.
Figure 6C:
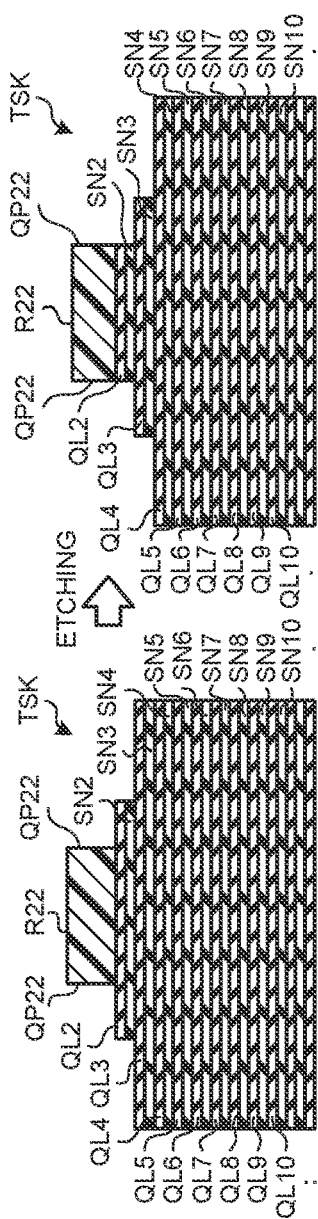
Figure 6D:
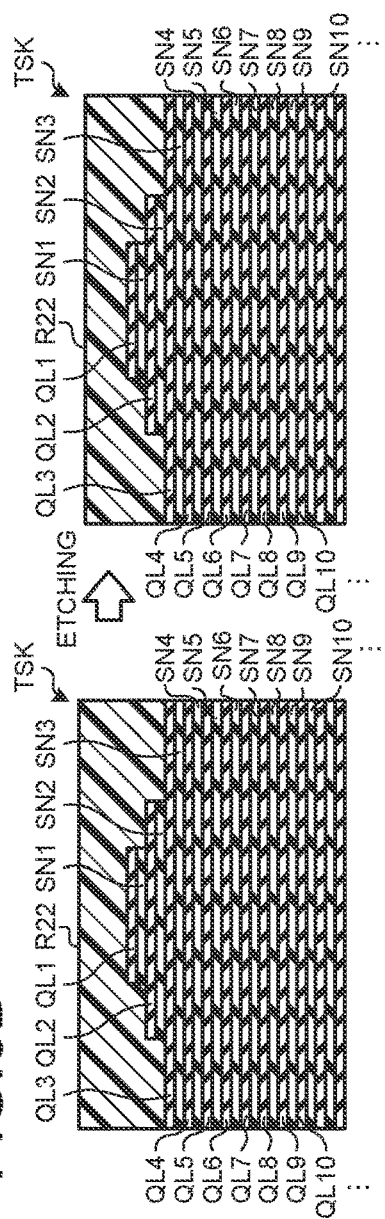
Figure 6A:
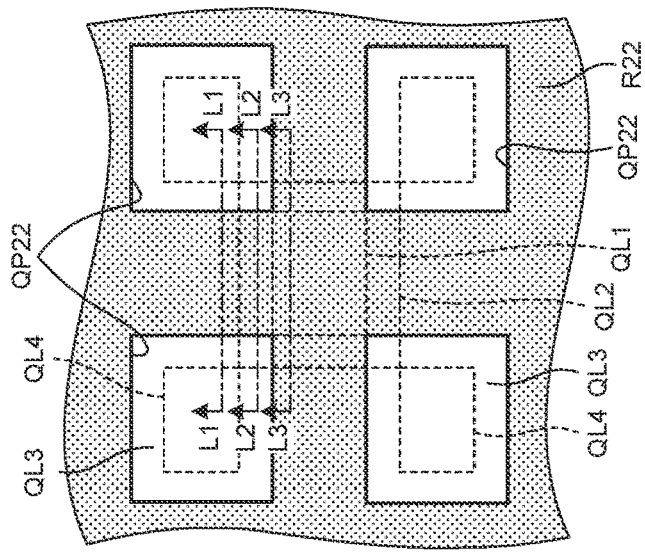

Subsequently, when the photoresist film R21 is slimmed, the opening QP21 is uniformly expanded to be an opening QP22, as illustrated in FIG. 6A. In other words, a photoresist film R22 having the opening QP22 larger than the opening QP21 can be obtained. As illustrated in the figure, these openings QP22 are arranged so that each opening corner of the openings QP22 is in contact with four respective corners of the convex insulating layer QL1 and sacrificial layer SN1 formed by the etching so far and the long sides of the insulating layer QL1 and the opening QP22 are continuous. In other words, the photoresist film R21 is slimmed so that the opening QP22 is arranged as described above, and the photoresist film R22 having the opening QP22 is obtained. In the plan view, the opening QP22 exposes the insulating layer QL4 having a rectangular shape and the frame-shaped insulating layer QL3 surrounding the insulating layer QL4.

The fourth etching is performed using the photoresist film R22 as a mask. As illustrated in FIG. 6B, in the region where the photoresist film R22 is provided on the convex insulating layer QL3 and sacrificial layer SN3, the shape of the convex insulating layer QL3 and sacrificial layer SN3 are transferred to the insulating layer QL4 and the sacrificial layer SN4. Thus, the convex insulating layer QL4 and sacrificial layer SN4 are obtained, and the insulating layer QL5 is exposed in a concave shape on both sides of the obtained layers. In addition, the convex insulating layer QL3 and sacrificial layer SN3 remain under the photoresist film R22, exposing the insulating layer QL4 in a concave shape on both sides of the remaining layers. In other words, the insulating layer QL3 and the sacrificial layer SN3 forms a convex portion. This allows the large convex insulating layer QL4 and sacrificial layer SN4 and the small convex insulating layer QL3 and sacrificial layer SN3 to be formed in two steps on the insulating layer QL5.

In addition, as illustrated in FIG. 6C, in the region where the photoresist film R22 is provided on the convex insulating layer QL2 and sacrificial layer SN2, the shape of the convex insulating layer QL2 and sacrificial layer SN2 are transferred to the insulating layer QL3 and the sacrificial layer SN3. Thus, the convex insulating layer QL3 and sacrificial layer SN3 are obtained, and the insulating layer QL4 is exposed on both sides of the obtained layers. In addition, the convex insulating layer QL2 and sacrificial layer SN2 remain under the photoresist film R22, exposing the insulating layer QL3 on both sides of the remaining layers. This allows the large convex insulating layer QL3 and sacrificial layer SN3 and the small convex insulating layer QL2 and sacrificial layer SN2 to be formed in two steps on the insulating layer QL4. Moreover, as illustrated in FIG. 6D, the region covered with a photoresist film R23 does not change even after this etching.

Figure 7A:
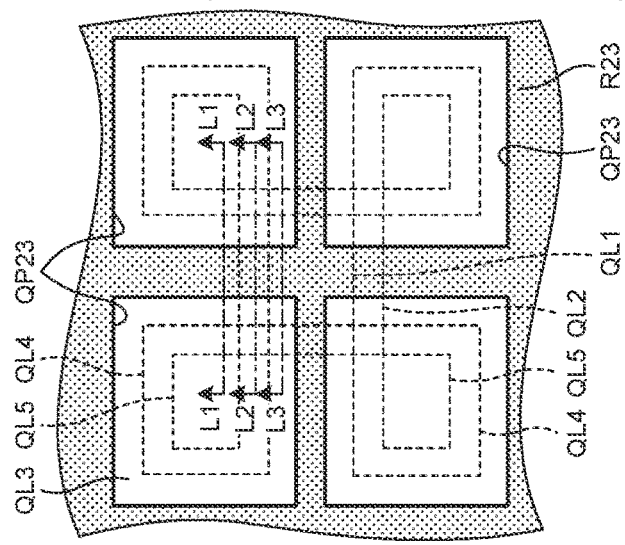
FIGS. 7A to 7D are diagrams illustrated to describe a method of forming a staircase portion of the semiconductor memory device according to the embodiment.

Subsequently, when the photoresist film R22 is slimmed, the opening QP22 is uniformly expanded to be an opening QP23, as illustrated in FIG. 7A. In other words, a photoresist film R23 having the opening QP23 larger than the opening QP22 can be obtained. As illustrated in the figure, the opening QP23 exposes the insulating layer QL5 having a rectangular shape, the frame-shaped insulating layer QL4 surrounding the insulating layer QL5, and the frame-shaped insulating layer QL3 surrounding the insulating layer QL4 in a plan view.

Figure 7B:
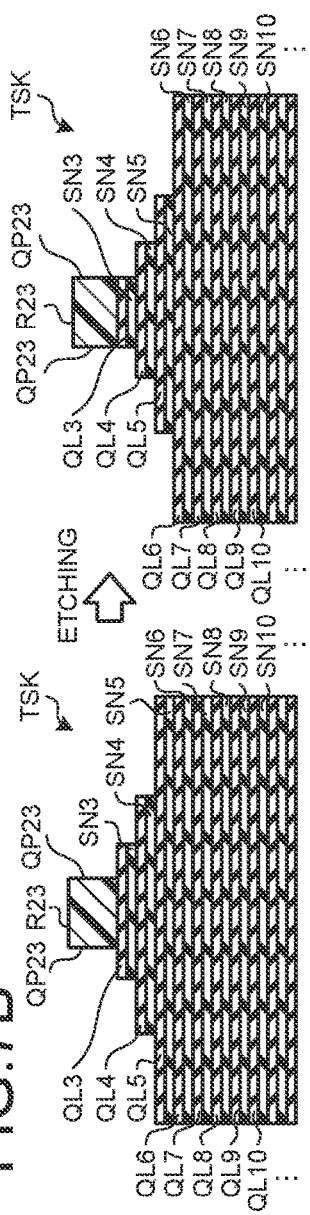

The fifth etching is performed using the photoresist film R23 as a mask. As illustrated in FIG. 7B, in the region where the photoresist film R23 is provided on the insulating layer QL3, the shape of the convex insulating layer QL4 and sacrificial layer SN4 are transferred to the insulating layer QL5 and the sacrificial layer SN5 to be a concave shape. Thus, the convex insulating layer QL5 and sacrificial layer SN5 are obtained, and the insulating layer QL6 is exposed in a concave shape on both sides of the obtained layers. The shape of the convex insulating layer QL3 and sacrificial layer SN3 are transferred to the insulating layer QL4 and the sacrificial layer SN4 to be a concave shape. In addition, the insulating layer QL3 and the sacrificial layer SN3, which are uncovered with the photoresist film R23, are etched. This allows three steps of the large convex insulating layer QL5 and sacrificial layer SN5, the smaller convex insulating layer QL4 and sacrificial layer SN4, and the further smaller convex insulating layer QL3 and sacrificial layer SN3 to be formed on the exposed insulating layer QL6.

Figure 7C:
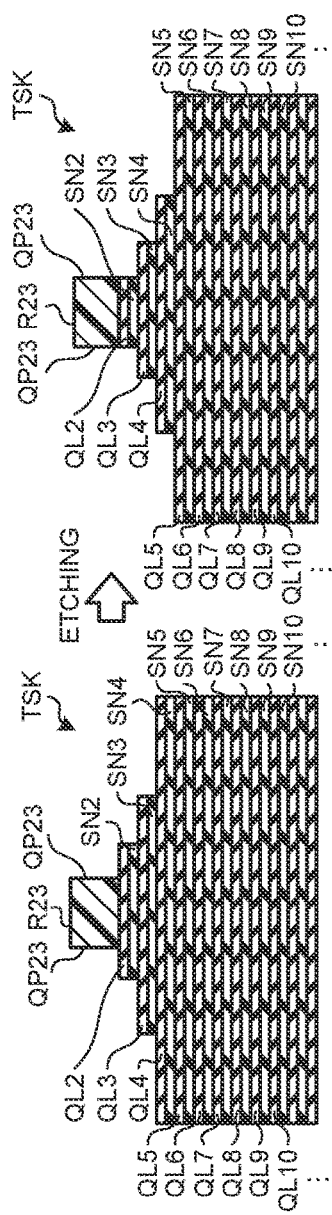

In addition, as illustrated in FIG. 7C, in the region where the photoresist film R23 is provided on the convex insulating layer QL2 and sacrificial layer SN2, the shape of the convex insulating layer QL3 and sacrificial layer SN3 are transferred to the insulating layer QL4 and the sacrificial layer SN4. Thus, the convex insulating layer QL4 and sacrificial layer SN4 are obtained, and the insulating layer QL5 is exposed on both sides of the obtained layers. In addition, the convex insulating layer QL2 and sacrificial layer SN2 are transferred in shape to the insulating layer QL3 and the sacrificial layer SN3 to obtain the convex insulating layer QL3 and sacrificial layer SN3. Further, the convex insulating layer QL2 and sacrificial layer SN2 remain under the photoresist film R23, exposing the insulating layer QL3 on both sides of the remaining layers. This allows three steps of the large convex insulating layer QL4 and sacrificial layer SN4, the smaller convex insulating layer QL3 and sacrificial layer SN3, and the further smaller convex insulating layer QL2 and sacrificial layer SN2 to be formed on the insulating layer QL5.

Figure 7D:
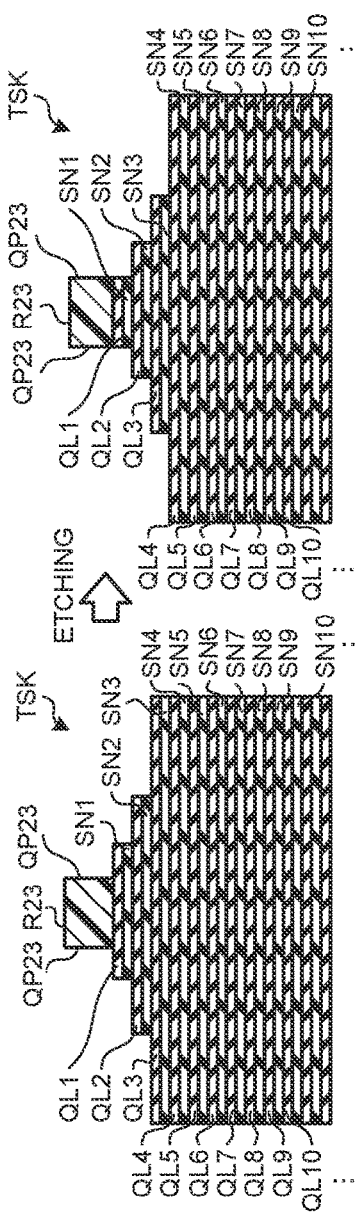

Referring to FIG. 7D, the photoresist film R23 is formed on the insulating layer QL1. The etching using the photoresist film R23 forms, on the insulating layer QL4, three steps of the large convex insulating layer QL3 and sacrificial layer SN3, the smaller convex insulating layer QL2 and sacrificial layer SN2, and the further smaller convex insulating layer QL1 and sacrificial layer SN1.

Then, referring to FIG. 8A, a photoresist film R31 is formed on the stacked body TSK. The photoresist film R31 has two openings QP31, each of which is elongated in the vertical direction in the figure. Specifically, each opening QP31 extends over two of the four regions in which the four openings QP21 of the photoresist film R21 are previously arranged, and the insulating layers QL6, QL5, and QL4 are exposed in a staircase manner. On the other hand, the insulating layers QL1 to QL3 are covered with the photoresist film R31. Moreover, in a later process, the plate-like portion ST (FIG. 1) is formed along the alternate long and short dash line LL in FIG. 8A. Thus, two regions in which the opening QP21 is previously arranged are exposed through the opening QP31. These two regions are arranged to cross the plate-like portion ST formed later.

The sixth etching is performed using the photoresist film R31 as a mask. Specifically, as illustrated in FIG. 8B, the layers from the insulating layer QL6 to the sacrificial layer SN7 exposed through the opening QP31 of the photoresist film R31, that is, the insulating layer QL6, the sacrificial layer SN6, the insulating layer QL7, and the sacrificial layer SN7 are removed to be a concave shape. In other words, in the sixth etching, two sets of the insulating layer and sacrificial layer are removed. Thus, the insulating layer QL8 is exposed to be a concave shape. On the insulating layer QL8, in the plan view, three sets of large convex insulating layer and sacrificial layer, that is, the insulating layer QL5 and the sacrificial layer SN5, the insulating layer QL6 and the sacrificial layer SN6, and the insulating layer QL7 and the sacrificial layer SN7 are formed. Then, the small convex insulating layer QL4 and sacrificial layer SN4 on the layers above and the further smaller convex insulating layer QL3 and sacrificial layer SN3 on the layers above are formed.

With reference to FIG. 8C, in a similar manner, on the insulating layer QL7 exposed in a concave shape, in the plan view, three sets of large convex insulating layer and sacrificial layer, that is, the insulating layer QL4 and the sacrificial layer SN4, the insulating layer QL5 and the sacrificial layer SN5, and the insulating layer QL6 and the sacrificial layer SN6 are formed. Then, the small convex insulating layer QL3 and sacrificial layer SN3 on the layers above and the further smaller convex insulating layer QL2 and sacrificial layer SN2 on the layers above are formed.

Further in FIG. 8D, on the insulating layer QL6 exposed in a concave shape, in the plan view, three sets of large convex insulating layer and sacrificial layer, that is, the insulating layer QL3 and the sacrificial layer SN3, the insulating layer QL4 and the sacrificial layer SN4, and the insulating layer QL5 and the sacrificial layer SN5 are formed. Then, the small convex insulating layer QL2 and sacrificial layer SN2 on the layers above and the further smaller convex insulating layer QL1 and sacrificial layer SN1 on the layers above are formed.

Subsequently, when the photoresist film R31 is slimmed, the opening QP31 is uniformly expanded to be an opening QP32, as illustrated in FIG. 9A. In other words, a photoresist film R32 having the opening QP32 larger than the opening QP31 is formed. Specifically, each opening QP32 extends over two of the four regions in which the four openings QP22 of the photoresist film R22 are previously arranged.

The seventh etching is performed using the photoresist film R32 as a mask. In this etching, two sets of insulating layer and sacrificial layer are also etched. Specifically, as illustrated in FIG. 9B, in the portion where the insulating layers QL5 and QL8 are exposed through an opening of the photoresist film R32, the layers from the insulating layer QL8 to the sacrificial layer SN9 are etched to expose the insulating layer QL10 in a concave shape. Simultaneously, the layers from the insulating layer QL5 to the sacrificial layer SN6 are etched to expose the insulating layer QL7 in a concave shape.

Similarly, as illustrated in FIG. 9C, in the portion where the insulating layers QL4 and QL7 are exposed through an opening of the photoresist film R32, the layers from the insulating layer QL7 to the sacrificial layer SN8 are etched to expose the insulating layer QL9 in a concave shape. Simultaneously, the layers from the insulating layer QL4 to the sacrificial layer SN5 are etched to expose the insulating layer QL6 in a concave shape.

Further, as illustrated in FIG. 9D, in the portion where the insulating layers QL3 and QL6 are exposed through an opening of the photoresist film R32, the layers from the insulating layer QL3 to the sacrificial layer SN4 are etched to expose the insulating layer QL5 in a concave shape. Simultaneously, the layers from the insulating layer QL6 to the sacrificial layer SN7 are etched to expose the insulating layer QL8 in a concave shape.

Figure 10A:
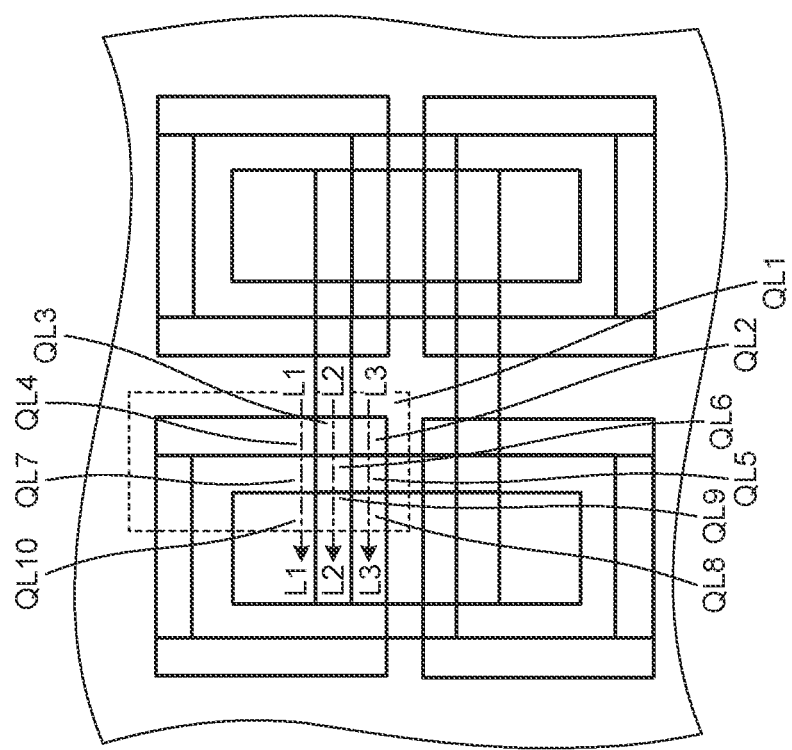
FIGS. 10A and 10B are diagrams illustrated to describe a method of forming a staircase portion of the semiconductor memory device according to the embodiment.
Figure 10B:
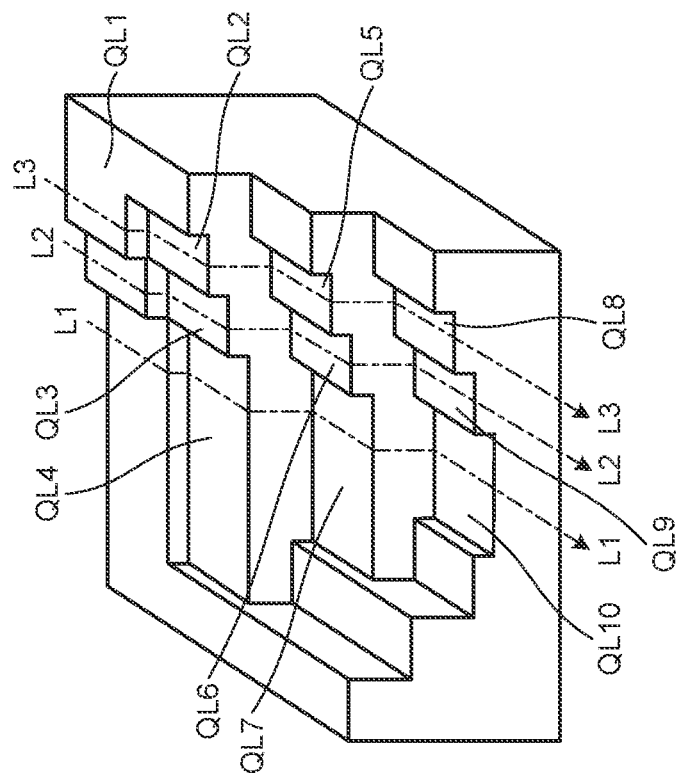

Then, when the photoresist film R32 removed, as illustrated in FIGS. 10A and 10B, the layers from the insulating layer QL1 to the insulating layer QL10 are partially exposed to obtain a temporary staircase portion to be the staircase portion SR. FIG. 10A is a top view of the staircase portion formed as described above, and FIG. 10B is a perspective view of the staircase portion. As illustrated in FIG. 10A, the nine insulating layers from the insulating layer QL2 to the insulating layer QL10 are arrayed in a planar-view grid pattern, and each of them is used as a terrace surface. In addition, as illustrated in FIG. 10B, three staircases in which each step has three sets of insulating layer and sacrificial layer are formed along lines L1-L1, L2-L2, and L3-L3, that is, the x-direction of FIG. 1 and arranged in three rows in the y-direction of FIG. 1, which is a direction intersecting the lines L1-L1, L2-L2, and L3-L3. In addition, in this temporary staircase portion, three staircases in which each step has a set of the insulating layer and the sacrificial layer can be formed in the y-direction of FIG. 1, which is the intersecting direction.

Figures 11A, 11B:
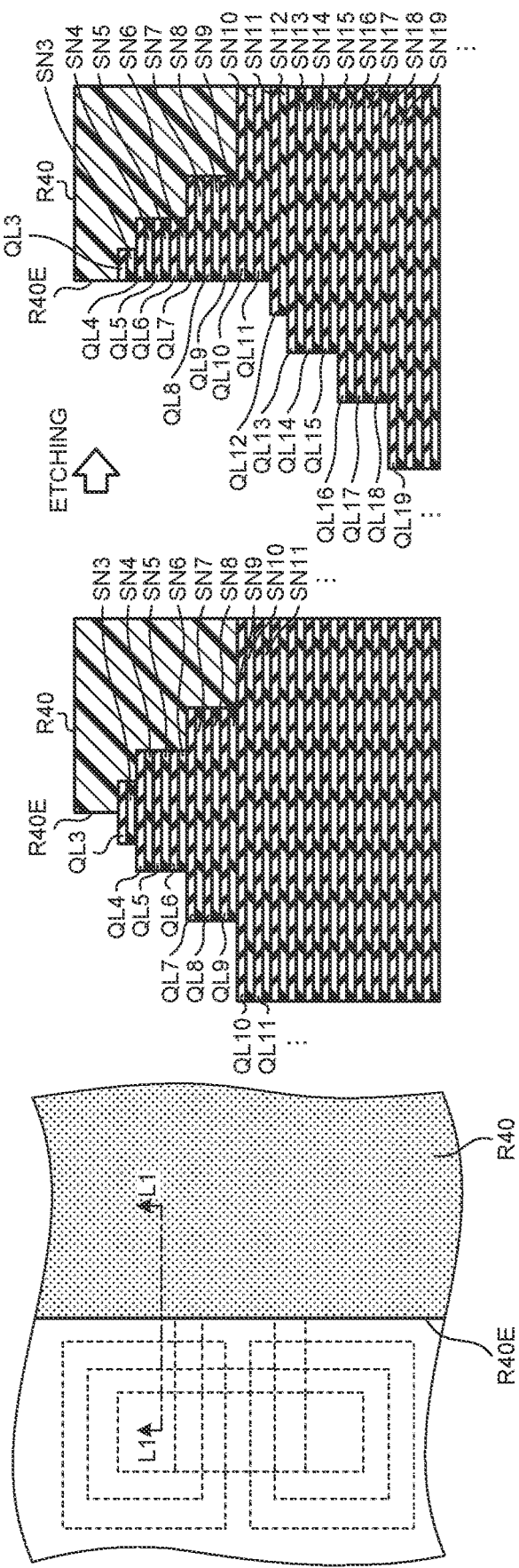
FIGS. 11A and 11B are diagrams illustrated to describe a method of forming a staircase portion of the semiconductor memory device according to the embodiment.

Then, as illustrated in FIG. 11A, a photoresist film R40 is formed to cover the two staircase portions on the right side of the four staircase portions illustrated in FIG. 10A. FIG. 11A is a top view of the photoresist film R40, and FIG. 11B is a cross-sectional view taken along line L1-L1 of FIG. 11A before and after etching with the photoresist film R40. Moreover, line L1-L1 in FIG. 11A corresponds to line L1-L1 in FIGS. 3A to 9D.

As illustrated in FIG. 11B, nine sets of insulating layer and sacrificial layer are removed by etching in a region exposed from the photoresist film R40, that is, a region on the left side of an edge R40E of the photoresist film R40. Thus, the stepped shape before etching is transferred to the lower insulating layer and sacrificial layer. Specifically, the insulating layers QL4, QL7, and QL10 are previously exposed as terrace surfaces before etching. Still, the insulating layers QL13, QL16, and QL19 are exposed after etching. On the other hand, in the portion covered with the photoresist film R40, the insulating layers QL4, QL7, and QL10 as the terrace surfaces remain exposed after the removal of the photoresist film R40. In other words, the use of the photoresist film R40 to perform the etching doubles the number of insulating layers as terrace surfaces from three to six in the region along line L1-L1. This also applies to the regions along lines L2-L2 and L3-L3 illustrated in FIGS. 3A to 9D. Thus, after this etching, a total of 18 insulating layers QL are exposed as terrace surfaces.

Then, for example, a silicon oxide film is deposited to cover the temporary staircase portion formed as described above, and when this silicon oxide film is flattened by, for example, a chemical-mechanical polishing (CMP) method, the second interlayer insulating film IL2 (FIGS. 2A and 2B) is formed. Here, each Insulating layer QL mentioned above is also formed of silicon oxide, so the second interlayer insulating film IL2 and the respective insulating layers QL are substantially integrated. Thus, the sacrificial layer SN rather corresponds to the terrace surface, for example, like the sacrificial layer SNB under the insulating layer QL4. Then, a slit for the plate-like portion ST (e.g., see FIG. 1) is formed, and the sacrificial layer SN is replaced with the conductive layer WL through the slit. As described above, the conductive layer WL can be formed of, for example, a metal such as tungsten. Thus, the temporary staircase portion becomes the staircase portion SR. Subsequently, holes (not illustrated) that penetrate the second interlayer insulating film IL2 are formed. Each hole reaches each of 18 conductive layers WL including the conductive layers WL2 to WL10 (FIGS. 2A and 2B). These holes are embedded with metal to form the contacts CC (FIGS. 2A and 2B). In this case, the 18 conductive layers WL are used as a word line of the memory cell MC (FIG. 2B). Moreover, as described above, the conductive layer WL1 can function as a gate line of the source-side selection transistor.

The description is now given of an example of the position where the contacts CC are arranged between the staircase portion SR that has a new terrace surface by the processing illustrated in FIG. 11B and the staircase portion SR that is adjacent to the staircase portion SR in the X-direction and is not subjected to the processing of FIG. 11B.

FIGS. 11C to 11E are diagrams illustrated to describe an example in which the contacts are arranged in the staircase portion of the semiconductor memory device according to the embodiment. FIG. 11C is a top view schematically illustrating four staircase portions SR corresponding to FIG. 10A. FIG. 11D is a perspective view of a region R1 of FIG. 11C viewed from the direction of the arrow, and FIG. 11E is a perspective view of a region R2 of FIG. 11C viewed from the direction of the arrow.

As illustrated in FIG. 11D, a staircase portion SR1 having a new terrace surface by the processing illustrated in FIG. 11B has conductive layers WL10 to WL19 as terrace surfaces. Of these, for example, the contacts CC can be arranged in three rows of staircases along lines LL1-LL1, LL2-LL2, and LL3-LL3, individually. In FIG. 11D, the arrangement position of the contacts CC is indicated by an elliptical line on each terrace surface.

The staircases along line LL1-LL1 have WL13, WL16, and WL19 as terrace surfaces, the staircases along line LL2-LL2 have WL12, WL15, and WL18 as terrace surfaces, and the staircases along line LL3-LL3 have WL11, WL14, and WL17 as terrace surfaces. All of these are formed to ascend toward another staircase portion SR2. The arrangement of the contacts CC on these terrace surfaces makes it possible to electrically connect the conductive layers WL11 to WL19 to the upper layer wiring.

As illustrated in FIG. 11E, the staircase portion SR2, which is adjacent to the staircase portion SR1 in the X-direction and is not subjected to the processing of FIG. 11B, has the conductive layers WL1 to WL10 as terrace surfaces. Of these, for example, the contacts CC can be arranged in three rows of staircases along lines LL4-LL4, LL5-LL5, and LL6-LL6, individually. In FIG. 11E, the arrangement position of the contacts CC is indicated by an elliptical line on each terrace surface.

The staircases along line LL4-LL4 have WL3, WL6, and WL9 as terrace surfaces, the staircases along line LL5-LL5 have WL2, WL5, and WL8 as terrace surfaces, and the staircases along line LL6-LL6 have WL1, WL4, and WL7 as terrace surfaces. All of these are formed to ascend toward another staircase portion SR1. The arrangement of the contacts CC on these terrace surfaces makes it possible to electrically connect the conductive layers WL1 to WL9 to the upper layer wiring.

In addition to this, the contacts CC are also arranged on the terrace surface having the conductive layer WL10, which is separated from these three rows of staircases. Thus, both the staircase portions SR1 and SR2 are combined, connecting the conductive layers WL1 to WL19 to the contacts CC.

However, the contact CC and the conductive layer WL10 can be connected at the staircase portion SR1. In this case, the contact CC is arranged on the terrace surface having the conductive layer WL10, which is separated from the three rows of staircases along lines LL1-LL1, LL2-LL2, and LL3-LL3.

As described above, in the plurality of staircase portions SR included in one block BLK, the layer of the conductive layers WL to which the contact CC is connected is different for each staircase portion SR. In other words, in each staircase portion SR, the layer of the conductive layers WL which forms the terrace surface on which the contact CC is arranged is different from each other.

Thus, one of the plurality of staircase portions SR included in one block BLK has a terrace surface with the conductive layer WL that is the uppermost layer of the stacked body SK. In addition, another staircase portion SR of the plurality of staircase portions SR included in one block BLK has a terrace surface with a conductive layer WL that is the lowest layer of the stacked body SK.

In the examples of FIGS. 11C to 11E, the staircase portion SR2 of the staircase portions SR1 and SR2 included in one block BLK has a terrace surface with the conductive layer WL1 that is the uppermost layer of the stacked body SK. In addition, the staircase portion SR1 has a terrace surface with the conductive layer WL19 that is the lowest layer of the stacked body SK.

Figure 12A:
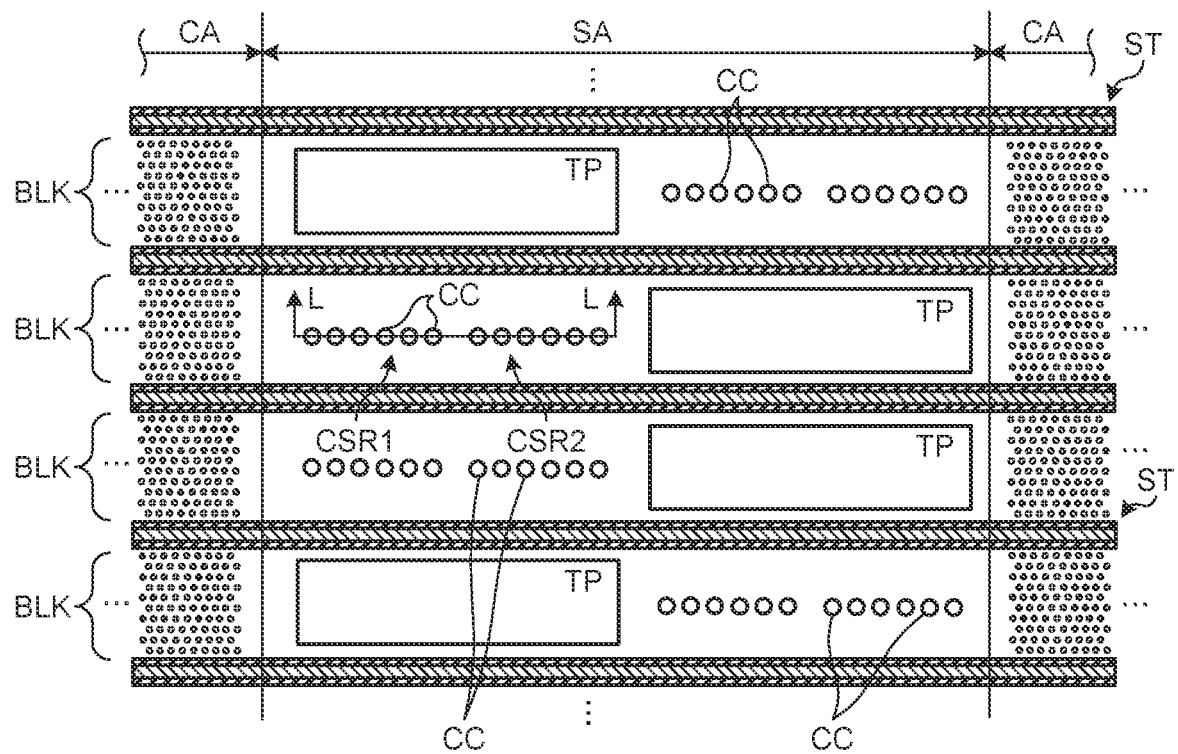
FIGS. 12A and 12B are diagrams illustrating a staircase portion of a semiconductor memory device according to a comparative example.
Figure 12B:
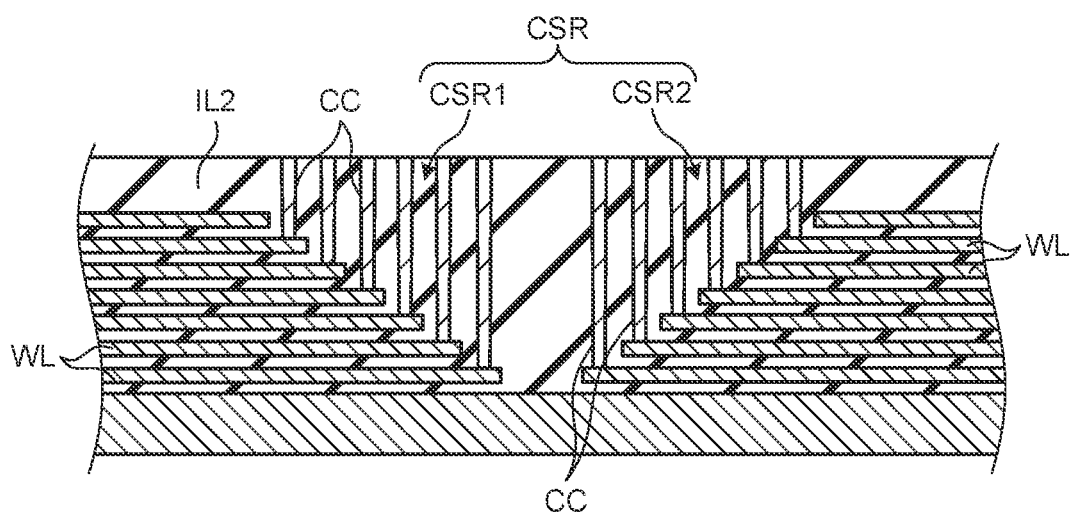

The effects of the semiconductor memory device and the method of manufacturing the same according to the present embodiment are now described with reference to comparative examples. FIGS. 12A and 12B are cross-sectional views illustrating a staircase portion in a semiconductor memory device according to a comparative example. In the semiconductor memory device according to the comparative example, for example, the two staircase portions SR of the staircase region SA in one block BLK of the semiconductor memory device according to the embodiment illustrated in FIG. 1 are replaced with staircase portions illustrated in FIGS. 12A and 12B. Thus, the semiconductor memory device according to the comparative example has the same structure as the semiconductor memory device according to the embodiment, except for, for example, the staircase portions of FIGS. 12A and 12B and the arrangement of the contacts and the upper layer wiring provided in the staircase portions.

As illustrated in FIGS. 12A and 12B, a staircase portion CSR of the semiconductor memory device according to the comparative example has a lowermost step in the center and has two staircases CSR1 and CSR2 that ascend in opposite directions in the x-direction. In addition, each of the staircases CSR1 and CSR2 includes six steps having the conductive layers as terrace surfaces. Such a configuration allows the staircase portion CSR to have a total of 12 terrace surfaces in the x-direction, each of the terrace surfaces connecting to the contact.

On the other hand, in the semiconductor memory device according to the present embodiment, three staircases, each having six terrace surfaces in the x-direction are provided, as apparent from FIG. 1 and FIGS. 10A and 10B. In other words, while a total of 18 terrace surfaces are provided, there are only six terrace surfaces in the x-direction. Thus, it is possible to reduce the length of the staircase portion SR in the x-direction in the embodiment as compared with the length of the staircase portion CSR in the x-direction in the comparative example. This also makes it possible to reduce the size of the semiconductor memory device.

Further, in the semiconductor memory device according to the comparative example, an unused region can occur between the staircase portion CSR and the plate-like portion ST adjacent to the staircase portion CSR. However, according to the semiconductor memory device according to the embodiment, it is possible to form the terrace surface in such a region, and so the contact CC can be connected to the terrace surface at the region. Thus, it is possible to effectively use the region that can be wasted, contributing to the miniaturization of the semiconductor memory device.

Furthermore, in the case of increasing the number of conductive layers to correspond to the number of memory cells provided in the memory pillar to expand the storage capacity of the semiconductor memory device, a terrace surface is provided accordingly. The increase in the number of terrace surfaces causes the increase of the number of staircase portions. In this regard, for example, the staircase portion CSR of the semiconductor memory device according to the comparative example has 12 terrace surfaces as illustrated in FIGS. 12A and 12B, so the number of staircase portions CSR equal to the quotient obtained by dividing the number of terrace surfaces by 12 plus one is necessary.

On the other hand, according to the semiconductor memory device according to the embodiment, it is possible for the staircase portion SR to provide 18 terrace surfaces, so the number of staircase portions SR can be smaller than that of the staircase portions CSR according to the comparative example by dividing the number of terrace surfaces by 18. Moreover, such difference increases as the number of terrace surfaces, that is, the number of conductive layers increases. Thus, the expansion of the storage capacity increases the effects achieved by the staircase portion SR in the embodiment.

Moreover, in the embodiments mentioned above, two staircase portions SR are provided in one staircase region SA. Still, the embodiment is not limited to this example, and for example, three or more staircase portions SR can be provided depending on the number of layers of the stacked body SK (TSK).

Further, in the embodiments mentioned above, the staircase portion SR has staircases arranged in three rows in the y-direction. Still, the present embodiment is not limited to this example, and the staircase portion SR can have staircases arranged in four or more rows. In this case, in the x-direction, one step can be a staircase having four or more conductive layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a staircase portion provided in a first region of a stacked body and provided with staircases, the stacked body having a plurality of conductive layers and a plurality of insulating layers stacked alternately one by one, the staircase portion having the conductive layers as terrace surfaces, and the staircases being arranged in n rows (where n is an integer of three or more) in a first direction intersecting a stacking direction of the stacked body;
a columnar body provided in a second region of the stacked body, the columnar body penetrating the stacked body in the stacking direction and having a plurality of memory cells at each of positions facing the plurality of conductive layers, and the second region being arranged so as to sandwich the first region in a second direction intersecting the stacking direction and the first direction; and
a plurality of contacts each connected to a respective one of the terrace surfaces,
wherein:
the staircases included in the staircase portion are each formed to ascend for each first step having p (n=p) conductive layers of the plurality of conductive layers in the second direction, and
the terrace surfaces arranged in the first direction, from among the terrace surfaces of the staircases to which the plurality of contacts are connected, are different in height from each other and are formed to ascend for each second step having one conductive layer of the plurality of conductive layers in the first direction.

2. The semiconductor memory device according to claim 1, further comprising:
a plate-like portion extending in the stacked body in the second direction and dividing the stacked body into a plurality of blocks each including the first region and the second region.

3. The semiconductor memory device according to claim 2, wherein at least two of the staircase portions are provided in the first region of at least one of the blocks divided by the plate-like portion.

4. The semiconductor memory device according to claim 3, wherein the terrace surface included in the staircase portion provided in one block includes a conductive layer different from a conductive layer constituting the terrace surface included in another staircase portion.

5. The semiconductor memory device according to claim 4, wherein:
one staircase portion of the staircase portions provided in one block includes the terrace surface including an uppermost conductive layer of the plurality of conductive layers, and another staircase portion of the staircase portions provided in one block includes the terrace surface including a lowest conductive layer of the plurality of conductive layers.

6. The semiconductor memory device according to claim 3, wherein:
the staircase portion provided in one block includes:
a first staircase portion; and
a second staircase portion adjacent to the first staircase portion,
the staircases included in the first staircase portion are formed to ascend toward the second staircase portion for each first step, and
the staircases included in the second staircase portion are formed to ascend toward the first staircase portion for each first step.

7. The semiconductor memory device according to claim 3, wherein the staircase portions provided in one block are arranged side by side in the second direction.

8. The semiconductor memory device according to claim 2, wherein the staircase portion arranged in the first direction to sandwich the plate-like portion has a line-symmetric configuration with respect to the plate-like portion in two adjacent blocks of the plurality of blocks.

9. The semiconductor memory device according to claim 8, wherein the terrace surface arranged in the first direction of the terrace surfaces included individually in the staircase is formed to ascend for each second step toward the plate-like portion in each of the staircase portions provided in the two adjacent blocks.

10. A semiconductor memory device comprising:
a staircase portion provided in a first region of a stacked body and provided with staircases, the stacked body having a plurality of conductive layers and a plurality of insulating layers stacked alternately one by one, the staircase portion having the conductive layers as terrace surfaces, and the staircases being arranged in n rows (where n is an integer of three or more) in a first direction intersecting a stacking direction of the stacked body;
a columnar body provided in a second region of the stacked body, penetrating the stacked body in the stacking direction, and having a plurality of memory cells at each of positions facing the plurality of conductive layers;
a contact connected to one of terrace surfaces; and
a plate-like portion extending in the stacked body in a second direction and dividing the stacked body into a plurality of blocks each including the first region and the second region, the second direction intersecting the stacking direction and the first direction,
wherein:
the staircases included in the staircase portion are each formed to ascend for each first step having p (n=p) conductive layers of the plurality of conductive layers in the second direction,
the terrace surfaces arranged in the first direction are different in height from each other and are formed to ascend for each second step having one conductive layer of the plurality of conductive layers in the first direction, at least two of the staircase portions are provided in one of the blocks divided by the plate-like portion, the staircase portion provided in one block includes: a first staircase portion; and a second staircase portion adjacent to the first staircase portion, the staircases included in the first staircase portion are formed to ascend toward the second staircase portion for each first step, and the staircases included in the second staircase portion are formed to ascend toward the first staircase portion for each first step.

* * * * *